US011605015B2

(12) United States Patent
Anschuetz et al.

(10) Patent No.: US 11,605,015 B2
(45) Date of Patent: Mar. 14, 2023

(54) HYBRID QUANTUM-CLASSICAL COMPUTER SYSTEM FOR IMPLEMENTING AND OPTIMIZING QUANTUM BOLTZMANN MACHINES

(71) Applicant: Zapata Computing, Inc., Boston, MA (US)

(72) Inventors: Eric R. Anschuetz, Cambridge, MA (US); Yudong Cao, Cambridge, MA (US)

(73) Assignee: Zapata Computing, Inc., Boston, MA (US)

( * ) Notice: Subject to any disclaimer, the term of this patent is extended or adjusted under 35 U.S.C. 154(b) by 567 days.

(21) Appl. No.: 16/662,895

(22) Filed: Oct. 24, 2019

(65) Prior Publication Data

US 2020/0134502 A1 Apr. 30, 2020

Related U.S. Application Data

(60) Provisional application No. 62/749,942, filed on Oct. 24, 2018.

(51) Int. Cl.
*G06N 10/00* (2022.01)
*G06F 17/18* (2006.01)
(Continued)

(52) U.S. Cl.
CPC ............. *G06N 10/00* (2019.01); *G06F 17/18* (2013.01); *G06F 30/367* (2020.01); *G06N 7/08* (2013.01)

(58) Field of Classification Search
CPC ........ G06N 10/00; G06N 20/00; G06N 10/20; G06N 3/0445; G06N 3/0472;
(Continued)

(56) References Cited

U.S. PATENT DOCUMENTS 9,663,358 B1  5/2017 Cory et al.
11,468,289 B2  10/2022 Cao et al.
(Continued)

FOREIGN PATENT DOCUMENTS

EP   3504667 A1 * 7/2019 ............ G06F 17/18
KR   101822326 B1  12/2016
(Continued)

OTHER PUBLICATIONS

Gregory et al.; "Simulation of Quantum Walks via Hamiltonian Reduction"; 2018 IEEE Nanotechnology Symposium (ANTS) Year: 2018 | Conference Paper | Publisher: IEEE; Cited by: Papers (1) (Year: 2018).*
(Continued)

*Primary Examiner* — Helen Rossoshek
(74) *Attorney, Agent, or Firm* — Blueshift IP, LLC; Robert Plotkin

(57) ABSTRACT

A hybrid quantum-classical (HQC) computer prepares a quantum Boltzmann machine (QBM) in a pure state. The state is evolved in time according to a chaotic, tunable quantum Hamiltonian. The pure state locally approximates a (potentially highly correlated) quantum thermal state at a known temperature. With the chaotic quantum Hamiltonian, a quantum quench can be performed to locally sample observables in quantum thermal states. With the samples, an inverse temperature of the QBM can be approximated, as needed for determining the correct sign and magnitude of the gradient of a loss function of the QBM.

22 Claims, 8 Drawing Sheets

(51) Int. Cl.
G06N 7/08 (2006.01)
G06F 30/367 (2020.01)

(58) Field of Classification Search
CPC .......... G06N 3/0635; G06N 3/08; G06N 7/08; G06F 17/18; G06F 9/4403; G06F 30/367
See application file for complete search history.

(56) References Cited

U.S. PATENT DOCUMENTS

| | | |
|---|---|---|
| 2007/0239366 A1 | 10/2007 | Hilton et al. |
| 2007/0288684 A1 | 12/2007 | Bergou et al. |
| 2015/0032994 A1 | 1/2015 | Chudak et al. |
| 2015/0317558 A1 | 11/2015 | Adachi et al. |
| 2015/0363708 A1* | 12/2015 | Amin ............... G06N 10/00 712/42 |
| 2016/0328253 A1 | 11/2016 | Majumdar |
| 2017/0223094 A1 | 8/2017 | Johnson et al. |
| 2017/0364362 A1* | 12/2017 | Lidar ............... G06N 10/00 |
| 2017/0364796 A1 | 12/2017 | Wiebe et al. |
| 2018/0165601 A1 | 6/2018 | Wiebe et al. |
| 2018/0247200 A1 | 8/2018 | Rolfe |
| 2019/0197358 A1 | 6/2019 | Madani et al. |
| 2019/0213495 A1 | 7/2019 | Babbush et al. |
| 2019/0354897 A1* | 11/2019 | Horesh ............. G06N 20/00 |
| 2019/0384597 A1* | 12/2019 | Horesh ............. G06F 15/80 |
| 2019/0393399 A1 | 12/2019 | Leipold et al. |
| 2020/0057957 A1 | 2/2020 | Johnson et al. |
| 2020/0117702 A1* | 4/2020 | Babbush ........... G06N 10/00 |
| 2020/0118025 A1 | 4/2020 | Romero et al. |
| 2020/0394537 A1 | 12/2020 | Wang et al. |
| 2021/0232963 A1 | 7/2021 | Gimeno-Segovia et al. |
| 2021/0256351 A1 | 8/2021 | Cao et al. |
| 2021/0287761 A1* | 9/2021 | Camps ............. G16C 10/00 |

FOREIGN PATENT DOCUMENTS

| | | |
|---|---|---|
| KR | 20160147988 A | 12/2016 |
| WO | 2017066695 A1 | 4/2017 |
| WO | 2018064535 A1 | 4/2018 |
| WO | 2019032103 A1 | 2/2019 |
| WO | 2019077240 A1 | 4/2019 |
| WO | 2019177951 A1 | 9/2019 |
| WO | 2020037253 A1 | 2/2020 |
| WO | 2020077288 A1 | 4/2020 |
| WO | 2020086867 A1 | 4/2020 |
| WO | 2020077288 A9 | 3/2021 |
| WO | 2021102344 A1 | 5/2021 |
| WO | 2021163487 A1 | 8/2021 |
| WO | 2021247125 A2 | 12/2021 |
| WO | 2022155277 A1 | 7/2022 |
| WO | 2022173497 A2 | 8/2022 |
| WO | 2022173497 A9 | 9/2022 |

OTHER PUBLICATIONS

Cubitt et al.; "Complexity Classification of Local Hamiltonian Problems"; 2014 IEEE 55th Annual Symposium on Foundations of Computer Science; Year: 2014 | Conference Paper | Publisher: IEEE; Cited by: Papers (7) (Year: 2014).*
Besnier, V., et al., "This Dataset Does Not Exist: Training Models From Generated Images", Cornell University. pp. 1-6 (Nov. 7, 2019) Available online at [https://arxiv.org/abs/1911.02888].
Dallaire-Demers, P.L., et al., "Quantum Generative Adversarial Networks," Physical Review A, vol. 98, No. 1, p. 012324, pp. 1-10 (Apr. 2018).
He, Z., et al., "A Conditional Generative Model Based on Quantum Circuit and Classical Optimization", International Journal of Theoretical Physics, vol. 58, pp. 1138-1149 (2019).
International Search Report and Written Opinion dated Jun. 7, 2021, in international patent application No. PCT/US2021/017863, 7 pages.
Kaneko, T., and Harada, T., "Noise Robust Generative Adversarial Networks", Cornell University. pp. 1-29, Nov. 26, 2019. Available online at [https://arxiv.org/abs/1911.11776v1].
Amin, M.H., et al., "Quantum Boltzmann Machine", Phys. Rev. X 8, 021050 URL:https://arxiv.org/abs/1601.02036, vol. 8, No. 2, pp. 1-10 (Jan. 8, 2016).
Anschuetz, E.R., and Zanoci, C., "Near-Term Quantum-Classical Associative Adversarial Networks", Phys. Rev. A, URL: https://arxiv.org/abs/1905.13205, vol. 100, No. 5, 052327, pp. 1-11 (2019).
Ackley, D.H., et al., "A Learning Algorithm for Boltzmann Machines," Cognitive Science, vol. 9, No. 1, pp. 147-169 (1985).
Amin, M.H., et al., "Quantum Boltzmann Machine," Physical Review X, vol. 8, No. 1, Available online https://journals.aps.org/prx/abstract/10.1103/PhysRevX.8.021050, pp. 021050-1-021050-11 (May 23, 2018).
Barahona, F., "On the computational complexity of Ising spin glass models," Journal of Physics A: Mathematical and General, vol. 15, No. 10, pp. 3241-3253 (1982).
Benedetti, M., et al., "Estimation of effective temperatures in quantum annealers for sampling applications: A case study with possible applications in deep learning," Phys. Rev. A, vol. 94, No. 2, 022308, pp. 1-15 (Aug. 9, 2016).
Biamonte, J.D., et al., "Realizable Hamiltonians for universal adiabatic quantum computers," Phys. Rev. A, vol. 78, No. 1, 012352, pp. 1-7 (2008).
D'Alessio, L., et al., "From quantum chaos and eigenstate thermalization to statistical mechanics and thermodynamics," Advances in Physics, vol. 65, No. 3, pp. 1-130 (2016).
Deutsch, J.M., "Quantum statistical mechanics in a closed system," Phys. Rev. A, vol. 43, No. 4, pp. 2046-2049 (Feb. 15, 1991).
Garcia-Saez, A., et al., "Local Temperature in Quantum Thermal States," vol. 79, No. 5, arXiv: 0808.0102v2, pp. 1-10 (Jun. 2, 2, 2009).
Garrison, J.R., et al., "Does a Single Eigenstate Encode the Full Hamiltonian?" Physical Review X, vol. 8, No. 2, pp. 021026-1-021026-24 (2018).
International Search Report and Written Opinion dated Feb. 10, 2020 in International patent application No. PCT/US2019/057893, 7 pages.
Kaufman, A.M., et al., "Quantum thermalization through entanglement in an isolated many-body system," Science, vol. 353, No. 6301, pp. 794-800 (Aug. 19, 2016) DOI: 10.1126/science.aaf6725.
Kiefer, J., et al., "Stochastic Estimation of the Maximum of a Regression Function," Ann. Math. Statist. vol. 23, No. 3, pp. 462-466 (1952).
Kieferova, M., et al, "Tomography and generative training with quantum Boltzmann machines," Phys. Rev. A, vol. 96, No. 6. 062327, pp. 1-2 (Dec. 22, 2017) (Abstract).
Mandra, S., et al., "Strengths and weaknesses of weak-strong cluster problems: A detailed overview of state-of-the-art classical heuristics versus quantum approaches," Phys. Rev. A, vol. 94, No. 6, 022337, pp. 1-14 (Aug. 29, 2016).
Preskill, J., "Quantum Computing in the NISQ era and beyond," arXiv: 1801.00862v3, pp. 1-20 (Jul. 31, 2018).
Spall, J.C., "A Stochastic Approximation Technique for Generating Maximum Likelihood Parameter Estimates," in 1987 American Control Conference, pp. 1161-1167 (1987).
Srednicki, M., "Chaos and quantum thermalization," Phys. Rev. E, vol. 50, No. 2, 888, pp. 1-30 (Aug. 1, 1994).
Verdon, G., et al., "A quantum algorithm to train neural networks using low-depth circuits," Quantum Physics, arXiv:1712.05304 [quant-ph], pp. 1-9 (Dec. 14, 2017).
Gao, N., et al., "High Dimensional Similarity Search with Quantum-Assisted Variational Autoencoder," arXiv:2006.0768v1, Available at URL https://arxiv.org/pdf/2006.07680.pdf, pp. 1-9 (Jun. 13, 2020).
Han, Z., et al., "Unsupervised Generative Modeling Using Matrix Product States," arXiv:1709.01662v3, Available online at URL https://arxiv.org/pdf/1709.01662.pdf, pp. 1-13 (Jul. 19, 2018).
International Search Report and Written Opinion dated Sep. 29, 2022, in PCT patent application No. PCT/US2021/062191, 8 pages.
Niu, M.Y., et al., "Learnability and Complexity of Quantum Samples," arXiv:2010.11983v1. Available at URL < https://arxiv.org/pdf/2010.11983.pdf>, pp. 1-19 (Oct. 22, 2020).

(56) References Cited

OTHER PUBLICATIONS

Yang, S., et al., "Loop Optimization for Tensor Network Renormalization," arXiv:1512.04938v2, Available online at URL <https://arxiv.org/pdf/1512.04938.pdf>, vol. 118, No. 11, pp. 1-15 (Feb. 25, 2017).
"Quantum Computing: Progress and Prospects" National Academies of Sciences, Engineering, and Medicine, pp. 1-273 (2019).
Aaronson, S., and Chen, L., "Complexity-Theoretic Foundations of Quantum Supremacy Experiments", arXiv:1612.05903v2, pp. 1-66 (Dec. 26, 2016).
Abadi, M., et al., "TensorFlow: Large-Scale Machine Learning on Heterogeneous Distributed Systems", pp. 1-19 (Preliminary White Paper, Nov. 9, 2015), software available from tensorflow.org, http://tensorflow.org/.
Anschuetz, E.R., and Cao, Y., "Realizing Quantum Boltzmann Machines Through Eigenstate Thermalization," arXiv preprint, arXiv:1903.01359 [quant-ph], pp. 1-30 (Mar. 4, 2019).
Aspuru-Guzik, A., et al., "Simulated Quantum Computation of Molecular Energies", Science, Quantum Physics, vol. 309, No. 5741, pp. 1-21 (Sep. 9, 2005).
Aspuru-Guzik, A., et al., "The Matter Simulation (R)evolution", ACS Cent. Sci., 4, 2, pp. 144-152 (2018).
Bach, V., et al., "Generalized Hartree-Fock Theory and the Hubbard Model", Journal of Statistical Physics, vol. 76 (1-2):3-89, pp. 1-68 (Nov. 25, 1993).
Baydin, A.G., et al., "Automatic Differentiation in Machine Learning: a Survey", Journal of Machine Learning Research, vol. 18, No. 1, pp. 1-43 (2018).
Benedetti, M., et al., "A generative modeling approach for benchmarking and training shallow quantum circuits", arXiv preprint arXiv:1801.07686v4, pp. 1-16 (Jun. 2, 2019).
Benedetti, M., et al., "Quantum-assisted Helmholtz machines: A quantum-classical deep learning framework for industrial datasets in near-term devices", Quantum Physics, ArXiv 1708.09784v3, pp. 1-11 (Mar. 19, 2018).
Bengio, Y., et al., "Greedy layer-wise training of deep networks", NIPS'06: Proceedings of the 19th International Conference on Neural Information Processing Systems, pp. 1-8 (Dec. 2006).
Bergholm, V., et al., "PennyLane: Automatic differentiation of hybrid quantumclassical computations", arXiv preprint arXiv:1811.049683, pp. 1-15 (2018).
Biamonte, J., et al., "Quantum machine learning", Nature 549, pp. 195-292 (2016).
Bogoljubov, N.N., "A New Method in the Theory of Superconductivity", Soviet Physics JETP, vol. 34, No. 7, pp. 41-46 (Jul. 1958).
Boixo, S., et al., "Characterizing Quantum Supremacy in Near-Term Devices", Nature Physics, vol. 14, pp. 1-23 (Aug. 3, 2016).
Bonet-Monroig, "Comparison of Error mitigation Strategies in a Hydrogen Molecule Quantum Simulation", Master thesis. Leiden University, pp. 1-52 (May 29, 2018).
Brassard, G., et al., "Quantum Amplitude Amplification and Estimation", arXiv:quant-ph/0005055v1, pp. 1-22 (May 15, 2000).
Bravyi, L. D., et al., "Fermionic Quantum Computation", Annals of Physics, vol. 298, No. 1, pp. 210-226 (2002).
Cao, Y., et al., "Quantum Neuron: an elementary building block for machine learning on quantum computers", arXiv:1711.11240v1, pp. 1-30 (2017).
Chen, H., et al., "Universal discriminative quantum neural networks", arXiv preprint arXiv:1805.08654v1, pp. 1-19 (May 22, 2018).
Chiles, R.A., et al., "An electron pair operator approach to coupled cluster wave functions, application to He2, Be2, and Mg2 and comparison with CEPA methods", The Journal of Chemical Physics, vol. 74, No. 8, pp. 4544-4556 (1981).
Cirq, https://github.com/quantumlib/Cirq, Available online, copyright 2019, 2 pages.
Colless, J.I., et al., "Computation of Molecular Spectra on a Quantum Processor with an Error-Resilient Algorithm", Physical Review X, vol. 8, No. 1, pp. 011021-011027 (2018).
Colless, J.I., et al., "Robust determination of molecular spectra on a quantum processor," arxiv.org. Cornell University Library, 201 Olin Library Cornell University Ithaca, NY 14853, XP081278642, DOI: 10.1103/physrevx.8.011021, pp. 1-12 (Jul. 20, 2017).
Creswell, A., et al., "Generative Adversarial Networks: An Overview", IEEE Signal Processing Magazine, vol. 35, No. 1, pp. 1-14 (2017).
Dallaire-Demers, P.L., and Killoran, N., "Quantum generative adversarial networks", arXiv:1804.08641v2, Phys. Rev. A, vol. 98, 012324, pp. 1-10 (Apr. 30, 2018).
Dallaire-Demers, P.L., et al., "Low-depth circuit ansatz for preparing correlated fermionic states on a quantum computer", Quantum Physics, arXiv:1801.01053v1, pp. 1-15 (Jan. 3, 2018).
Dankert, C., et al., "Exact and approximate unitary 2-designs and their application to fidelity estimation", Physical Review A, vol. 80, No. 1, 012304, pp. 1-7 (Jul. 2009).
Du, Y., et al., "The Expressive Power of Parameterized Quantum Circuits", arXiv preprint arXiv:1810.11922V1, pp. 1-15 (2018).
Dyakonov, M., "The case against Quantum Computing", IEEE Spectrum, pp. 1-5 (Nov. 15, 2018).
Endo, S., et al., "Practical Quantum Error Mitigation for Near-Future Applications", Phys. Rev. X, vol. 8, 031027-1-031027-21 (2018).
Endo, S., et al., "Variational quantum algorithms for discovering Hamiltonian spectra", Physical Review A, arXiv preprint arXiv:1806.05707, pp. 1-9 (2018).
Extended European Search Report dated Dec. 7, 2021, in European patent application 19871859.5, 14 pages.
Extended European Search Report dated Dec. 7, 2021, in European patent application 19874946.7, 11 pages.
Extended European Search Report dated May 19, 2022, in European patent application No. 19850377.3, 10 pages.
Farhi, E., and Neven, H., "Classification with Quantum Neural Networks on Near Term Processors", arXiv preprint arXiv:1802.060022, pp. 1-21 (Aug. 30, 2018).
Farhi, E., et al., "A quantum approximate optimization algorithm", Quantum Physics, arXiv:1411.4028v1, pp. 1-16 (Nov. 14, 2014).
Garcia-Saez, A., et al., "Addressing Hard Classical Problems with Adiabatically Assisted Variational Quantum Eigensolvers", Quantum Physics, arXiv preprint arXiv:1806.02287, pp. 1-7 (2018).
Goemans, M.X., et al., "Improved Approximation Algorithms for Maximum Cut and Satisfiability Problems Using Semidefinite Programming", Journal of the ACM (JACM), vol. 42, No. 6, pp. 1115-1145 (Nov. 1995).
Gómez-Bombarelli, R., et al., "Automatic Chemical Design Using a Data-Driven Continuous Representation of Molecules", ACS Cent. Sci., vol. 4, No. 2, pp. 268-276 (2018).
Goodfellow, I. J., et al., "Generative adversarial nets", in Advances in neural information processing systems, pp. 1-9 (2014).
Goodfellow, I. J., et al., "Generative Adversarial Networks", arXiv:1406.2661v1 [stat.ML], 2014, pp. 1-9 (Jun. 10, 2014).
Goodfellow, I., "NIPS 2016 Tutorial: Generative Adversarial Networks", arXiv preprint arXiv:1701.00160v4, pp. 1-57 (2016).
Goodfellow, I., et al., "Deep Learning", Book, vol. 1 (MIT press Cambridge, 2016) available online at http://www.deeplearningbook.org, pp. 1-798.
Grant, E., et al., "Hierarchical quantum classifiers", npj Quantum Information, vol. 4, Article No. 65 ISSN 2056-6387, pp. 1-8 (2018).
Grover, L., and Rudolph, T., et al., "Creating superpositions that correspond to efficiently integrable probability distributions", arXiv preprint quantph/0208112v1, pp. 1-2 (2002).
Guimaraes, G., et al., "Objective-Reinforced Generative Adversarial Networks (ORGAN) for Sequence Generation Models", arXiv preprint arXiv:1705.10843v3, pp. 1-7 (2018).
Handy, N.C., et al., "Size-consistent Brueckner theory limited to double substitutions", Chemical Physics Letters, vol. 164, No. 2-3, pp. 185-192 (Dec. 8, 1989).
Havlicek, V., et al., "Supervised learning with quantum enhanced feature spaces", arXiv:1804.11326v2, pp. 1-22 (Jun. 5, 2018).
He, K., et al., "Deep Residual Learning for Image Recognition", Proceedings of the IEEE conference on computer vision and pattern recognition, pp. 770-778 (2016).

(56) References Cited

OTHER PUBLICATIONS

Final Office Action dated Aug. 25, 2022, in U.S. Appl. No. 16/543,165 of Peter D. Johnson, filed Aug. 16, 2019, 73 pages.
Hempel, C. et al., "Quantum chemistry calculations on a trapped-ion quantum simulator," arxiv.org, Cornell University Library, 201 Olin Library Cornell University Ithaca, NY 14853, XP080859698, pp. 1-21 (Mar. 27, 2018).
Horgan, J., "Will Quantum Computing Ever Live Up to Its Hype?", Quantum Computing, Scientific American, pp. 6 (Apr. 20, 2021).
Huggins, W., et al., "Towards quantum machine learning with tensor networks", Quantum Science and Technology, arXiv:1803.11532, vol. 4, No. 2, pp. 1-12 (Jul. 31, 2018).
International Search Report & Written Opinion dated Jan. 14, 2022, in international patent application No. PCT/US2021/024308, 7 pages.
International Search Report & Written Opinion dated Mar. 29, 2022, in international patent application No. PCT/US2022/012227, 6 pages.
International Search Report and Written Opinion dated Dec. 6, 2019 in PCT International Patent Application No. PCT/US2019/046895, 9 pages.
International Search Report and Written Opinion dated Feb. 4, 2020, in International Patent Application No. PCT/US2019/055970, 11 pages.
Johnson, P. D., et al., "QVECTOR: an algorithm for device-tailored quantum error correction", arXiv preprint arXiv:1711.022491, pp. 1-16 (Nov. 7, 2017).
Johnson, P.D., et al., "A Method for Improving Quantum Optimization Algorithms: The Marginals Optimization Procedure", ICE 5th Conference on Quantum Information, Spain, (May 28-31, 2019), Book of Abstracts p. 59.
Jordan, P., et al., "In The Collected Works of Eugene Paul Wigner: Part A: The Scientific Papers—Chapter: Über das Paulische Äquivalenzverbot", pp. 109-129. Springer (1993).
Kadurin, A., et al., "druGAN: An Advanced Generative Adversarial Autoencoder Model for de Novo Generation of New Molecules with Desired Molecular Properties in Silico," Molecular Pharmaceutics 2017, vol. 14, 9, pp. 3098-3104 (Jul. 13, 2017) (Abstract).
Kandala, A., et al., "Extending the computational reach of a noisy superconducting quantum processor", arXiv preprint arXiv:1805.04492v1, pp. 1-10 (2018).
Kandala, A., et al., "Hardware-efficient Variational Quantum Eigensolver for Small Molecules and Quantum Magnets", Nature, vol. 549, pp. 1-24 (2017).
Liu, J., and Wang, L., "Differentiable learning of quantum circuit Born machines", Phys. Rev. A 98, 062324, pp. 1-9 (2018).
Liu, Y., "The Complexity of the Consistency and N-Representability Problems for Quantum States", Quantum Physics, arXiv preprint arXiv:0712.3041, pp. 1-89 (2007).
Liu, Y., et al., "Quantum computational complexity of the N-representability problem: QMA complete", Physical review letters, vol. 98, No. 11, pp. 1-6 (2007).
Lloyd, S., "Universal Quantum Simulators", Science, vol. 273, No. 5278, pp. 1073-1078 (Aug. 23, 1996).
Lloyd, S., and Weedbrook, C., "Quantum Generative Adversarial Learning", Phys. Rev. Lett. Vol. 121, No. 4, pp. 040502-1-040502-5 (2018).
Lloyd, S., et al., "Quantum embeddings for machine learning," https://arxiv.org/abs/2001.03622, pp. 1-11 (Feb. 10, 2020).
M. Plesch, M., and Brukner, C., "Quantum-State Preparation with Universal Gate Decompositions", Phys. Rev. A 83, arXiv:1003.5760v2, 032302, pp. 1-5 (Mar. 4, 2011).
McClean, J. R., et al., "Barren plateaus in quantum neural network training landscapes", Nature Communications, vol. 9, pp. 1-6, (2018).
McClean, J. R., et al., "The theory of variational hybrid quantum-classical algorithms", New Journal of Physics, vol. 18, pp. 1-22 (Feb. 5, 2016).
McClean, J.R., et al., "Hybrid Quantum-Classical Hierarchy for Mitigation of Decoherence and Determination of Excited States", Physical Review A, vol. 95, No. 4, pp. 1-10 (2017).
Mescheder, L., et al., "Which Training Methods for GANs do actually Converge?", International Conference on Machine Learning, pp. 1-39 (2018).
Mitarai, K. et al., "Quantum Circuit Learning", Phys. Rev. A 98, 032309, DOI:10.1103/PhysRevA.98.032309, arXiv:1803.00745 [quant-ph], pp. 1-7 (2019).
Moll, N., et al, "Quantum optimization using variational algorithms on near-term quantum devices," Quantum Science and Technology, vol. 3, pp. 18 (Jun. 19, 2018) [retrieved on Nov. 25, 2019]. Retrieved from <https://iopscience.iop.org/article/10.1088/2058-9565/aab822/pdf>.
Motta, M., et al., "Low rank representations for quantum simulation of electronic structure", Computational Physics, Quantum Physics, arXiv:1808.02625v2, pp. 1-8 (Aug. 9, 2018).
Niemann, P., et al., "Logic Synthesis for Quantum State Generation", 2016 IEEE 46th International Symposium on Multiple-Valued Logic (ISMVL), Sapporo, pp. 247-252 (2016).
Non-Final Office Action dated Dec. 24, 2021, in U.S. Appl. No. 17/174,900 of Yudong Cao, filed Feb. 12, 2021, 27 pages.
Non-Final Office Action dated May 11, 2022, in U.S. Appl. No. 16/543,165 of Peter D. Johnson, filed Aug. 16, 2019, 26 pages.
Notice of Allowance dated Apr. 15, 2022, for U.S. Appl. No. 17/174,900 of Yudong Cao, filed Feb. 12, 2021, 10 pages.
Panahi, A., et al., "word2ket: Space-efficient Word Embeddings inspired by Quantum Entanglement," International Conference on Learning Representations 2020, arXiv:1911.04975, pp. 1-10 (Mar. 3, 2020).
Paszke, A., et al., "Automatic differentiation in PyTorch", 31st Conference on Neural Information Processing Systems Long Beach, CA, USA, pp. 1-4 (NIPS 2017).
Perdomo-Ortiz, A., et al., "Opportunities and challenges for quantum-assisted machine learning in near-term quantum computers", Quantum Science and Technology, vol. 3, No. 3, pp. 1-14 (2018).
Peruzzo, A., et al., "A variational eigenvalue solver on a photonic quantum processor", Nature Communications, vol. 5, Article No. 4213, pp. 1-7 (2014).
Purvis, G.D., et al., "A full coupled-cluster singles and doubles model: The inclusion of disconnected triples", The Journal of Chemical Physics, vol. 76, No. 4, pp. 1910-1918 (Feb. 15, 1982).
Quantum Information Software Kit (QISKit), https://qiskit.org/ (2018).
Radford, A., et al., "Unsupervised Representation Learning with Deep Convolutional Generative Adversarial Networks", arXiv preprint arXiv:1511.06434, pp. 1-16 (2015).
Reiher, M., et al., "Elucidating Reaction Mechanisms on Quantum Computers", PNAS, vol. 114, No. 29, pp. 1-28 (2016).
Rolfe, J.T., "Discrete Variational Autoencoders", ICLR, pp. 1-33 (Apr. 22, 2017).
Romero et al., "Quantum autoencoders for efficient compression of quantum data", arXiv:1612.02806v2, Feb. 10, 2017, 11 pages. . [retrieved on Jan. 20, 2020]. Retrieved from <https://arxv.org/abs/1612.02806>.
Romero, J., and Aspuru-Guzik, A., "Variational quantum generators: Generative adversarial quantum machine learning for continuous distributions", Quantum Physics, arXiv:1901.00848 [quant-ph], pp. 1-15 (Jan. 3, 2019).
Romero, J., et al., "Strategies for quantum computing molecular energies using the unitary coupled cluster ansatz", arXiv:1701.02691v2 [quant-ph], vol. 4, No. 4, pp. 1-18 (Feb. 10, 2018).
Roth, R. M., et al., "Apathy Is Associated with Ventral Striatum Volume in Schizophrenia Spectrum Disorder", J Neuropsychiatry Clin Neurosci, 2016 Summe, vol. 28, No. 3, pp. 1-9 (Published online Feb. 22, 2016. doi: 10.1176/appi.neuropsych.15100241).
Rubin, N. C., et al., "Application of Fermionic Marginal Constraints to Hybrid Quantum Algorithms", New Journal of Physics, vol. 20, No. 5, 053020, pp. 1-21 (2018).
Rubin, N.C., "A Hybrid Classical/Quantum Approach for Large-Scale Studies of Quantum Systems with Density Matrix Embedding Theory", Quantum Physics, arXiv:1610.06910 [quant-ph], pp. 1-10, (2016).

(56) References Cited

OTHER PUBLICATIONS

Sanchez-Lengeling, B., and Aspuru-Guzik, A., "Inverse molecular design using machine learning: Generative models for matter engineering", Science 27, vol. 361, No. 6400, pp. 360-365 (Jul. 27, 2018).

Sanchez-Lengeling, B., et al., "Optimizing distributions over molecular space. An Objective-Reinforced Generative Adversarial Network for Inverse-design Chemistry (ORGANIC)", ChemRxiv preprint chemrxiv.5309668.v2, pp. 1-20 (2017).

Sarma, S.D., et al., "Majorana Zero Modes and Topological Quantum Computation", arXiv: 1501.02813v2, pp. 1-16, May 14, 2015 (retrieved on Nov. 17, 2019). Retrieved from <https://arxiv.org/abs/1501.02813>.

Schlittgen, B., et al., "Low-Energy Effective Theories of Quantum Spin and Quantum Link Models", Physical Review D, vol. 63. No 8, pp. 1-29 (Mar. 19, 2001).

Schuld, M., et al., "Circuit-centric quantum classifiers", arXiv:1804.00633v1, pp. 1-17 (Apr. 2, 2018).

Schuld, M., et al., "Evaluating analytic gradients on quantum hardware", arXiv preprint arXiv:1811.11184v1, pp. 1-8 (2018).

Schuld, M., et al., "Quantum machine learning in feature Hilbert spaces", Quantum Physics, arXiv:1803.07128, pp. 1-12 (Mar. 19, 2018).

Shor, P. W., "Algorithms for quantum computation: Discrete logarithms and factoring", Proceedings 35th Annual Symposium on Foundations of Computer Science (Shafi Goldwasser, ed.), IEEE, pp. 124-134 (1994).

Sim, S., et al., "A framework for algorithm deployment on cloud-based quantum computers", arXiv preprint arXiv:1810.10576v1, pp. 1-10 (Oct. 24, 2018).

Situ, H., et al., "Quantum generative adversarial network for discrete data", arXiv preprint arXiv:1807.01235v5, pp. 1-22 (2019).

Smith, R. S., et al., "A Practical Quantum Instruction Set Architecture", arXiv preprint arXiv:1608.03355v2, pp. 1-15 (2016).

Soklakov, A. N., and Schack, R., "Efficient state preparation for a register of quantum bits", Phys. Rev. A, 012307, arXiv:quant-ph/0408045v2, vol. 73, No. 1, pp. 1-26 (Nov. 22, 2005).

Spall, J. C., "A one-measurement form of simultaneous perturbation stochastic approximation", Automatica, vol. 33, No. 1, pp. 109-112 (1997).

Spall, J. C., "Adaptive stochastic approximation by the simultaneous perturbation method", IEEE Transactions on Automatic Control, vol. 45, No. 10, pp. 1839-1853 (Oct. 2000).

Steiger, D. S., et al., "ProjectQ: An Open Source Software Framework for Quantum Computing", Quantum, arXiv:1612.08091v2, vol. 2, pp. 1-13 (2016).

Steiger, D.S., et al., "Advantages of a modular high-level quantum programming framework," arXiv:1806.01861, pp. 1-11 (Jun. 5, 2018).

Temme, K., et al., "Error Mitigation for Short-Depth Quantum Circuits", Physical review letters, vol. 119, No. 18, 180509, pp. 1-15 (2017).

Valiant, L. G., "Quantum computers that Can Be Simulated Classically in Polynomial Time", SIAM Journal on Computing, vol. 31, No. 4, pp. 1-10 (2002).

Verdon, G., et al., "Quantum Hamiltonian-Based Models and the Variational Quantum Thermalizer Algorithm," Quantum Physics, arXiv:1910.02071, pp. 1-21 (Oct. 4, 2019).

Wan, K. H., et al., "Quantum generalisation of feedforward neural networks", npj Quantum Information, vol. 3, Article No. 36, arXiv:1612.01045, pp. 1-8 (2017).

Wang, D., et al., "Accelerated Variational Quantum Eigensolver", arXiv:1802.00171v3, pp. 1-11 (Mar. 25, 2019).

Wang, G., et al., "Minimizing Estimation Runtime on Noisy Quantum Computers," PRX Quantum 2.1 pp. 010346-1-49 (2021).

Wecker, D., et al., "Solving strongly correlated electron models on a quantum computer", Physical Review A, vol. 92, No. 6, pp. 1-27 (2015).

Wecker, D., et al., "Progress towards practical quantum variational algorithms", Phys. Rev. A 92, 042303, pp. 1-11 (Sep. 8, 2015).

Wecker, D., et al., "Towards Practical Quantum Variational Algorithms", Physical Review A, vol. 92, No. 4, 042303, pp. 1-11 (Sep. 8, 2015).

Wendin, G., "Quantum information processing with superconducting circuits: a review", Reports on Progress in Physics, vol. 80, No. 10, pp. 108 (2017).

You, Y., et al., "Machine learning spatial geometry from entanglement features," Phys. Rev. B 97, 045153, pp. 1-15 (Jan. 31, 2018).

Zeng, J., et al., "Learning and Inference on Generative Adversarial Quantum Circuits", arXiv preprint arXiv:1808.02893, vol. 99, No. 5, pp. 1-7 (2018).

Zhao, P., et al., "High-contrast ZZ interaction using superconducting qubits with opposite-sign anharmonicity," arXiv:2002.07560v2, pp. 1-16 (Mar. 27, 2021).

\* cited by examiner

HYBRID QUANTUM-CLASSICAL COMPUTER SYSTEM FOR IMPLEMENTING AND OPTIMIZING QUANTUM BOLTZMANN MACHINES

BACKGROUND

Quantum computers promise to solve industry-critical problems which are otherwise unsolvable or only very inefficiently addressable using classical computers. Application areas of quantum computers include chemistry and materials, bioscience and bioinformatics, and finance. Interest in quantum computing has recently surged, in part due to a wave of advances in quantum-computing performance.

Boltzmann machines were one of the first neural-network-based architectures in classical machine learning. Formed from layers of interconnected nodes, Boltzmann machines have been used in both supervised and unsupervised learning settings, and serve as a versatile tool for learning real-world data distributions. A classical Boltzmann machine can be interpreted as a set of spins that are interacting according to an Ising Hamiltonian that is diagonal in the natural basis of states representing the combination of spin-ups and spin-downs of the system. Recent efforts in quantum computation have shown that by considering quantum Hamiltonians which are non-diagonal, one is able to perform learning tasks with quantum Boltzmann machines that are beyond what is possible with classical computation.

In an analogy to a physical system, a Boltzmann machine is always in a special state, with respect to its Hamiltonian, called a thermal state. To fully realize the power of Boltzmann machines, a remaining practical question is how to prepare and measure thermal states on a noisy intermediate-scale quantum device. Some proposals in the literature point towards using quantum annealing devices as a source of (approximate) thermal states. However, the utility of such ideas is often limited by the inherent noise, connectivity, and the form of coupling allowed in the annealing device. More importantly, estimating the temperature of even classical thermal states is a challenging problem. With the rapid development of gate-model quantum computers, there exists a need to approximately prepare and measure a thermal state on these systems.

SUMMARY

Quantum Boltzmann machines (QBMs) are quantum-mechanical generalizations of classical Boltzmann machines that are more expressive than their classical counterparts, and thus can be used to learn probability distributions that challenge classical Boltzmann machines. QBMs may be trained using gradient-based methods similar to those developed for classical Boltzmann machines. However, QBM training with gradient-based methods requires sampling observables in quantum thermal distributions, a problem that is NP-hard. Advantageously, the present embodiments circumvent this problem with sampling techniques based on the eigenstate thermalization hypothesis (ETH), thereby providing a way to efficiently train QBMs on near-term quantum-computing devices.

In the present embodiments, a QBM is prepared in a pure state, and the state is evolved in time according to a chaotic, tunable quantum Hamiltonian. The pure state locally approximates a (potentially highly correlated) quantum thermal state at a known temperature. With the chaotic quantum Hamiltonian, a quantum quench can be performed to locally sample observables in quantum thermal states. With the samples, an inverse temperature of the QBM can be approximated, as needed for determining the correct sign and magnitude of the gradient of a loss function of the QBM.

QBMs may be used for similar applications as classical Boltzmann machines. For example, QBMs may be trained and used to create associate adversarial networks. In supervised learning, QBMs may be used, for example, in natural language processing, time-series prediction, and reinforcement learning. QBMs may also be used to implement autoencoders that reduce dimensionality of data, with applications in data compression. QBMs may also be used with classical Boltzmann machines. For example, a QBM may be used to improve training of a classical Boltzmann machine by more quickly finding the global optimum of a cost function of the classical Boltzmann machine.

One aspect of the invention is a computational device comprising a first plurality of qubits and a second plurality of qubits that is smaller than and coupled to the first plurality of qubits. A Boltzmann temperature measured of the second plurality of qubits is representative of a Boltzmann temperature of at least a portion of the first plurality of qubits.

Another aspect of the present invention is a method for sampling a quantum state of a computational device that includes a first plurality of qubits. The method comprises coupling a second plurality of qubits to the first plurality of qubits and measuring a Boltzmann temperature of the second plurality of qubits to provide a representation of a Boltzmann temperature of the first plurality of qubits. The second plurality of qubits is smaller than the first plurality of qubits.

Yet another aspect of the present invention is a training method for a quantum Boltzmann machine comprising a first plurality of qubits. The method comprises partially training the quantum Boltzmann machine, measuring the Boltzmann temperature of a second plurality of qubits smaller than the first plurality of qubits, and using the Boltzmann temperature of the second plurality of qubits to direct additional training of the quantum Boltzmann machine.

Another aspect of the present invention is a training method of the parameters of a quantum Boltzmann machine by first optimizing with respect to an upper bound of a loss function and then refining the optimization by utilizing black-box optimization techniques to train on the exact loss function approximated through sampling.

In one embodiment, a hybrid quantum-classical computer includes a classical computing component and a quantum computing component. The quantum computing component includes a first plurality of m qubits and a second plurality of n qubits prepared in a first quantum state, wherein n is less than m. The first plurality of qubits interact with each other according to a Hamiltonian specified by the classical computing component. The second plurality of qubits interacting with each other according to the Hamiltonian. The second plurality of qubits weakly interact with the first plurality of qubits according to the Hamiltonian. The quantum computing component also includes a measurement unit that measures: (1) a first set of expectation values of observables on the first plurality of qubits, and (2) a second set of expectation values of observables on the second plurality of qubits. The classical computing component also includes a processor that receives the first and second sets of expectation values from the measurement unit and prepares a second quantum state based on the first quantum state and the first and second sets of expectation values.

In another embodiment, a method for preparing a state of a quantum Boltzmann machine that follows a probability distribution which locally approximates a Boltzmann distribution at a known temperature is implemented on a hybrid quantum-classical computer. The hybrid quantum-classical computer includes a classical computing component and a quantum computing component. The quantum computing component includes a measurement unit, and a first plurality of m qubits and a second plurality of n qubits prepared in a first quantum state, wherein n is less than m. The first plurality of qubits interact with each other according to a Hamiltonian specified by the classical computing component. The second plurality of qubits interact with each other according to the Hamiltonian. The second plurality of qubits weakly interact with the first plurality of qubits according to the Hamiltonian. The classical computing component includes a processor, a non-transitory computer-readable medium, and computer-program instructions stored in the non-transitory computer-readable medium. The method includes, at the measurement unit of the quantum computing component: (1) measuring a first set of expectation values of observables on the first plurality of qubits, and (2) measuring a second set of expectation values of observables on the second plurality of qubits. The method also includes, at the classical computing component: (3) receiving the first and second sets of expectation values from the measurement unit, and (4) preparing a second quantum state based on the first quantum state and the first and second sets of expectation values.

Other features and advantages of various aspects and embodiments of the present invention will become apparent from the following description and from the claims.

BRIEF DESCRIPTION OF THE DRAWINGS

This invention is described with particularity in the appended claims. The above and further aspects of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Classical and Quantum Boltzmann Machines

Figure 1:
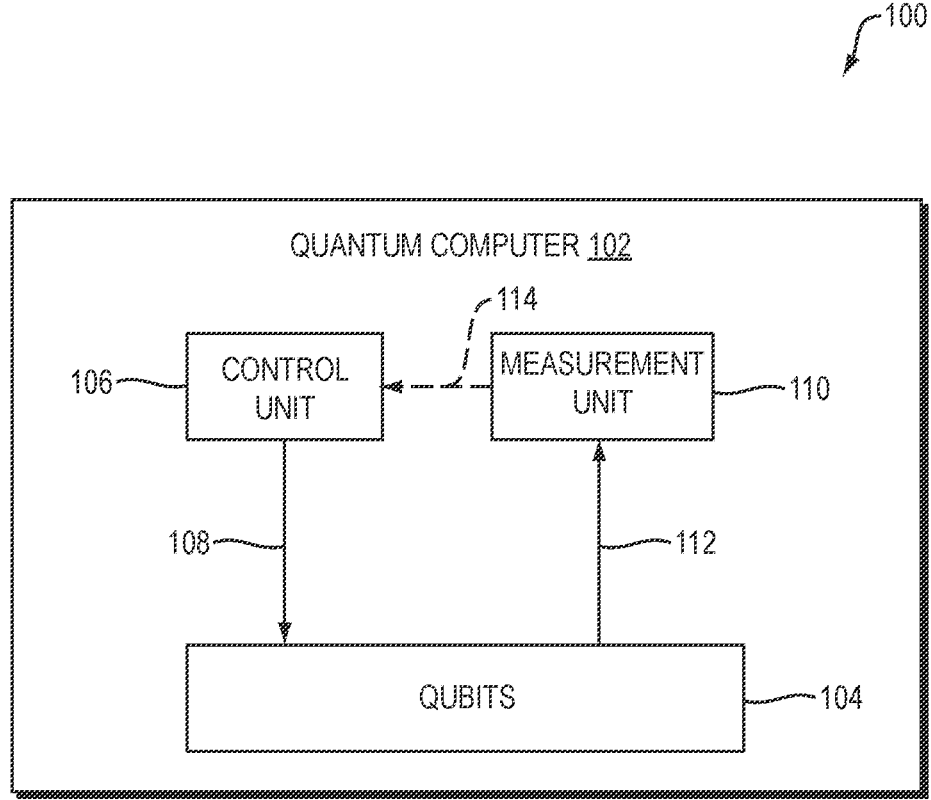
FIG. 1 is a diagram of a system implemented according to one embodiment of the present invention.

The goal of generative modeling is to train a model that generates data points that resemble a given set of data. In particular, a Boltzmann machine is an energy-based generative model that models the given data set as a thermal state under the classical Ising energy function $$E(\vec{z}; \vec{\theta}) = \sum_i b_i z_i + \sum_{i,j} w_{ij} z_i z_j, \quad (1)$$

where $\vec{z} \in \{-1,1\}^n$ is a binary vector and $\vec{\theta} = \{\vec{b}, \vec{w}\}$ are the model parameters. The n spins are separated into a bipartite structure of $n_v$ visible units and $n_h$ hidden units such that approximate sampling of the visible units in the thermal state can be performed via Gibbs sampling. In Eqn. 1, each of the indices i and j runs over all of the units, both hidden and visible. By contrast, a Boltzmann machine with the energy function $$E(\vec{z}; \vec{\theta}) = \sum_i b_i z_i + \sum_{v,h} w_{vh} z_v z_h, \quad (2)$$

is referred to as a restricted Boltzmann machine. In Eqn. 2, the index v runs only over the visible units, and the index h runs only over the hidden units. Thus, in a restricted Boltzmann machine, connections between hidden units are disallowed, and connections between visible units are disallowed (see FIG. 4).

A quantum Boltzmann machine (QBM) is a quantum generalization of a classical Boltzmann machine that is described by a quantum thermal probability distribution $$p_\beta(\vec{z}_v; \vec{\theta}) = \frac{tr\left(\prod_{\vec{z}_v} e^{-\beta H_{QBM}(\vec{\theta})}\right)}{tr\left(e^{-\beta H_{QBM}(\vec{\theta})}\right)} \quad (3)$$

where $H_{QBM}$ is a semi-restricted transverse Ising Hamiltonian $$H_{QBM}(\vec{\theta}) = \sum_i \Gamma_i \sigma_i^x + \sum_i b_i \sigma_i^z + \sum_{v,i} w_{vi} \sigma_v^z \sigma_i^z, \quad (4)$$

where $\vec{z}_v \in \{-1,1\}^{n_v}$, $\vec{\theta} = \{\vec{\Gamma}, \vec{b}, \vec{w}\}$, and $\Pi_{\vec{z}_v}$ is a projector of the visible units of the QBM onto $\vec{z}_v$. Here, the term "semi-restricted" means that the only connections between the hidden units are disallowed (see FIG. 4). Equation 4 can be generalized to $$H_{QBM}(\vec{\theta}) = H_{off-diag}(\vec{\theta}_{off-diag}) + \sum_i b_i \sigma_i^z + \sum_{v,i} w_{vi} \sigma_v^z \sigma_i^z, \quad (5)$$

where $H_{off-diag}(\vec{\theta}_{off-diag})$ is composed of terms that are not diagonal in the computational basis. For example, taking $H_{off-diag}$ to be composed of tunable $\sigma_i^x$ and $\sigma_i^x \sigma_j^x$ terms makes the ground state of $H_{QBM}$ of Eqn. 5 QMA-complete, and therefore more expressive than the Hamiltonian of Eqn. 4, which is generally believed to not be QMA-complete.

Figure 4:
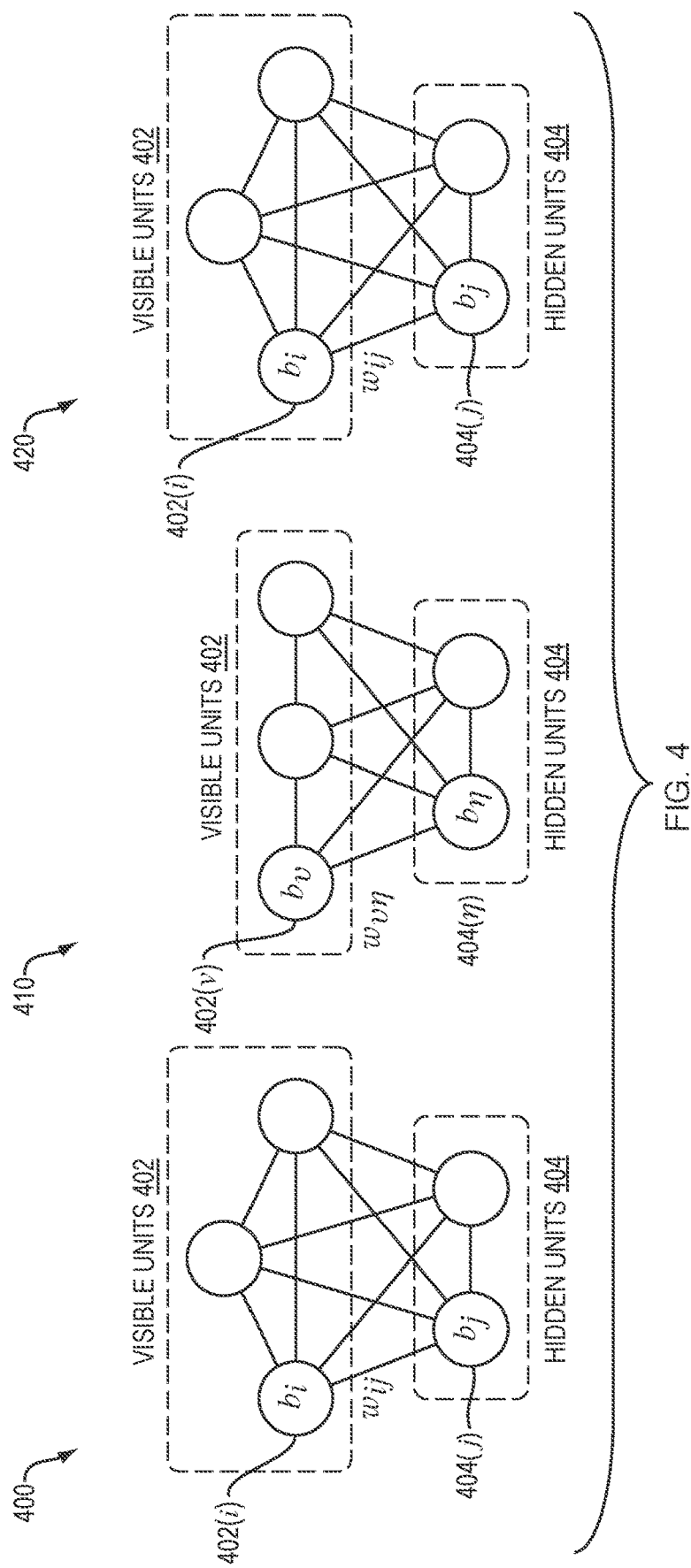
FIG. 4 shows one example of a Boltzmann machine, a restricted Boltzmann machine, and a semi-restricted Boltzmann machine.

FIG. 4 shows one example of a Boltzmann machine 400, a restricted Boltzmann machine 410, and a semi-restricted Boltzmann machine 420. Each of Boltzmann machines 400, 410, and 420 is formed from a plurality of visible units 402 and a plurality of hidden units 404. In Boltzmann machine 400, every pair of units is pairwise coupled with a weight w, of which only the weight $w_{ij}$ between a visible unit 402($i$) and a hidden unit 402($j$) is labeled. In addition, each unit has a local bias field b, of which only the local bias fields $b_i$ and $b_j$, for respective units 402($i$) and 404($j$), are indicated. Restricted Boltzmann machine 410 is similar to Boltzmann machine 400 except that visible units 402 are not pairwise coupled to each other, and hidden units 404 are not pairwise coupled to each other. Thus, each visible unit 402 of restricted Boltzmann machine 410 is pairwise coupled to all hidden units 404, and each hidden unit 404 is pairwise coupled to all visible units 402. Semi-restricted Boltzmann 420 is similar to Boltzmann machine 400 and restricted Boltzmann machine 410 except that only visible units 402 are pairwise coupled to each other, while hidden units 404 are not pairwise coupled to each other. While FIG. 4 shows each of Boltzmann machines 400, 410, and 420 having three visible units 402 and two hidden units 402, each of Boltzmann machines 400, 410, and 420 may have a different number of visible units 402 and a different number of hidden units 404 without departing from the scope hereof.

For both classical and quantum Boltzmann machines, the parameters $\vec{\theta}$ may be trained to minimize the negative log-likelihood $$\mathcal{L}(\vec{\theta}) = -\sum_{\vec{z}_v} p_{data}(\vec{z}_v) \log(p_\beta(\vec{z}_v; \vec{\theta})), \quad (6)$$

where $p_\beta(\vec{z}_v; \vec{\theta})$ is the thermal distribution corresponding to either a classical Boltzmann machine or a QBM. For QBMs, gradients of $\mathcal{L}$ are not efficiently sampleable. Thus, in practice, one trains on an upper bound of the loss function, which is given by $$\tilde{\mathcal{L}}(\vec{\theta}) = -\sum_{\vec{z}_v} p_{data}(\vec{z}_v) \log\left(\frac{tr\left(e^{-\beta H_v(\vec{\theta})}\right)}{tr\left(e^{-\beta H_{QBM}(\vec{\theta})}\right)}\right), \quad (7)$$

where $$H_v(\vec{\theta}) = H_{QBM}(\vec{\theta}) - \ln(\Pi_v). \quad (8)$$

Training a QBM on $\tilde{\mathcal{L}}$ not only prevents finding the optimal parameters for the true loss function $\mathcal{L}$, but also makes training $\vec{\theta}_{off\text{-}diag}$ generally impossible. Using generalized measurements, it is possible to train the off-diagonal elements, though deriving such measurements requires prior knowledge of the data distribution, and thus is difficult in practice. Herein, only training on the upper bound $\tilde{\mathcal{L}}$ is considered.

For a generic QBM, derivatives of Eqn. 7 with respect to the diagonal parameters $\{\vec{b}, \vec{w}\}$ are of the form $$\partial_{w_{ij}} \tilde{\mathcal{L}}(\vec{\theta}) = \beta \sum_{\vec{z}_v} p_{data}(\vec{z}_v) \left( \frac{tr\left(\sigma_i^z \sigma_j^z e^{-\beta H_v(\vec{\theta})}\right)}{tr(e^{-\beta H_v(\vec{\theta})})} - \frac{tr\left(\sigma_i^z \sigma_j^z e^{-\beta H_{QBM}(\vec{\theta})}\right)}{tr\left(e^{-\beta H_{QBM}(\vec{\theta})}\right)} \right), \quad (10)$$

$$\partial_{b_i} \tilde{\mathcal{L}}(\vec{\theta}) = \beta \sum_{\vec{z}_v} p_{data}(\vec{z}_v) \left( \frac{tr\left(\sigma_i^z e^{-\beta H_v(\vec{\theta})}\right)}{tr(e^{-\beta H_v(\vec{\theta})})} - \frac{tr\left(\sigma_i^z e^{-\beta H_{QBM}(\vec{\theta})}\right)}{tr\left(e^{-\beta H_{QBM}(\vec{\theta})}\right)} \right), \quad (9)$$

For an observable $O_\theta$ corresponding to the $\theta$-component of the gradient, Eqns. 9 and 10 can be equivalently expressed as $$\partial_\theta \tilde{\mathcal{L}}(\vec{\theta}) = \beta(\mathbb{E}_{z_v \sim p_{data}}[\langle O_\theta \rangle_{z_v}] - \langle O_\theta \rangle_{QBM}), \quad (11)$$

where the first expectation value is averaged with respect to the data distribution and the second with respect to the model distribution. Due to the form of $H_v$ (see Eqn. 8), the first term of these derivatives—the positive phase—is efficiently computable classically. The second term—the negative phase—is not believed to be efficiently computable in general, and if done exactly would require sampling from a general quantum thermal distribution, which is NP-hard. Embodiments herein approximately sample the local observables of Eqn. 11 from this quantum thermal distribution, taking advantage of the low weight of the operators that must be sampled.

Local Quantum Thermalization and the Eigenstate Thermalization Hypothesis

A necessary prerequisite of training QBM states is being able to sample local observables from thermal states at a known temperature. In general, preparing such thermal states is NP-hard. However, isolated quantum systems are known to thermalize locally; the mechanism under which this is believed to occur is known as the Eigenstate Thermalization Hypothesis (ETH). ETH states that subsystem thermalization occurs on the level of eigenstates of the system. Specifically, ETH is an ansatz for the matrix elements of an observable O in the eigenbasis $\{|E_i\rangle\}$ of the Hamiltonian:

$$\langle E_j | O | E_i \rangle = O_\omega(\bar{E}) \delta_{ij} + e^{-S(\bar{E})/2} f_O(\bar{E}, E_i - E_j) R_{ij}. \quad (12)$$

Here, $E_i = \langle E_i | O | E_i \rangle$, $\bar{E} = (E_i + E_j)/2$ is the average energy, and $O_\omega(\bar{E})$ is the expectation value of the microncanonical ensemble at an energy $\bar{E}$ with an energy window $\omega$, given by:

$$O_\omega(\bar{E}) = \langle\langle E' | O | E' \rangle\rangle_{E' \in [\bar{E} - \frac{\omega}{2}, \bar{E} + \frac{\omega}{2}]},$$

(13)

where $\omega$ vanishes in the thermodynamic limit (i.e., as the system size $n_v$ goes to infinity; usually, $\omega$ is taken to be $\mathcal{O}(\bar{E}/\sqrt{n_v})$). Finally, S is the microcanonical entropy, $f_O$ is a smooth function, and $R_{ij}$ is a complex random variable with zero mean and unit variance. Though unproven analytically, the ansatz of Eqn. 12 is conjectured to hold for all operators with support on less than half of the system in nonintegrable systems.

Furthermore, in the thermodynamic limit, if an operator O has equal microcanonical and canonical expectation values for a Hamiltonian H, then $$\langle E|O|E\rangle = \frac{(Oe^{-\beta(E)H})}{(e^{-\beta(E)H})}, \quad (14)$$

where $\beta(E)$ is such that $$E = \frac{(He^{-\beta(E)H})}{(e^{-\beta(E)H})}. \quad (15)$$

The microcanonical and canonical ensembles generically agree on the expectation values of observables with a volume of support sublinear in n for nonintegrable systems in the thermodynamic limit (assuming the entropy is concave in $\overline{E}$, which is typical in most physical settings).

Equation 14 is expected to hold for all observables with a volume of support sublinear in n in the thermodynamic limit, for all systems that exhibit an equivalence between the microcanonical and canonical ensembles. For systems that do not thermalize in the conventional sense, such as integrable systems and many-body localized systems, this equivalence can be generalized to an equivalence between the microcanonical ensemble and the generalized canonical ensemble.

Assuming that ETH holds in the sense of Eqn. 14 for a given system, a procedure is now presented for approximately sampling observables O with a constant volume of support k through only time evolution. First, assume that the system is represented by a Hamiltonian H composed of two noncommuting terms $H_0$ and $H_1$:

$$H = H_0 + H_1, \quad (16)$$

where an eigenstate $|E^{(0)}\rangle$ of $H_0$ is easy to prepare at time t=0. For times t>0, the eigenstate $|E^{(0)}\rangle$ evolves into a quenched state $|\psi(t)\rangle$ according to $$|\psi(t)\rangle = e^{-iHt}|E^{(0)}\rangle. \quad (17)$$

The time evolution represented in Eqn. 17 is referred to herein as a "quench". The long-time average of $\langle \psi(t)|O|\psi(t)\rangle$ with Eqn. 14 gives $$\overline{O} \equiv \lim_{t\to\infty} \frac{1}{t}\int_0^t dt' \langle\psi(t')|O|\psi(t')\rangle \approx \frac{tr(Oe^{-\beta(E^{(0)})H})}{tr(e^{-\beta(E^{(0)})H})} \quad (18)$$

The approximation in Eqn. 18 is exact in the limit n→∞, given that energy fluctuations in $E^{(0)}$ are small. Furthermore, $\beta(E^{(0)})$ is an effective inverse temperature dictated by the initial state $E_{(0)}$. In fact, it turns out that this equivalence is not only true in average, but also pointwise in time in the long-time limit. In practice, however, the thermalization time is modest compared to the inverse norm of the Hamiltonian H. More details on the necessary assumptions and the degree of approximation are presented below in the section titled "Local thermalization and QBM Quench Dynamics". Local thermalization after a quench has been verified experimentally with both superconducting qubits and ultracold atoms.

Training a QBM with ETH

The quench technique described above can be used to sample k-local observables in a thermal distribution. The observables to be sampled are 1- and 2-local (see Eqns. 9 and 10). However, when using quenching, $\beta$ generally depends on $\vec{\theta}$. Although one could, in principle, control $\beta$ through coupling the QBM to a large bath, this would require many ancilla qubits. Instead, $\beta$ is allowed to become a function of $\vec{\theta}$, which results in corrections to the derivatives of Eqns. 9 and 10 of the form:

$$g_\theta(\vec{\theta}) = \frac{\partial \beta(\vec{\theta})}{\partial \theta} \quad (19)$$

$$\sum_{\vec{z}_\nu} p_{data}(\vec{z}_\nu) \left( \frac{tr\left(H_\nu(\vec{\theta})e^{-\beta(\vec{\theta})H_\nu(\vec{\theta})}\right)}{tr\left(e^{-\beta(\vec{\theta})H_\nu(\vec{\theta})}\right)} - \frac{tr\left(H_{QBM}(\vec{\theta})e^{-\beta(\vec{\theta})H_{QBM}(\vec{\theta})}\right)}{tr\left(e^{-\beta(\vec{\theta})H_{QBM}(\vec{\theta})}\right)} \right).$$

To estimate $\beta$ at various $\theta$, the QBM can be coupled to an ancilla system of $\mathcal{O}(1)$ qubits. This ancilla system is referred to herein as a thermometer, and has a thermometer Hamiltonian $H_{therm}$ of the same form as the QBM Hamiltonian $H_{QBM}$, but with fixed parameters.

Figure 5:
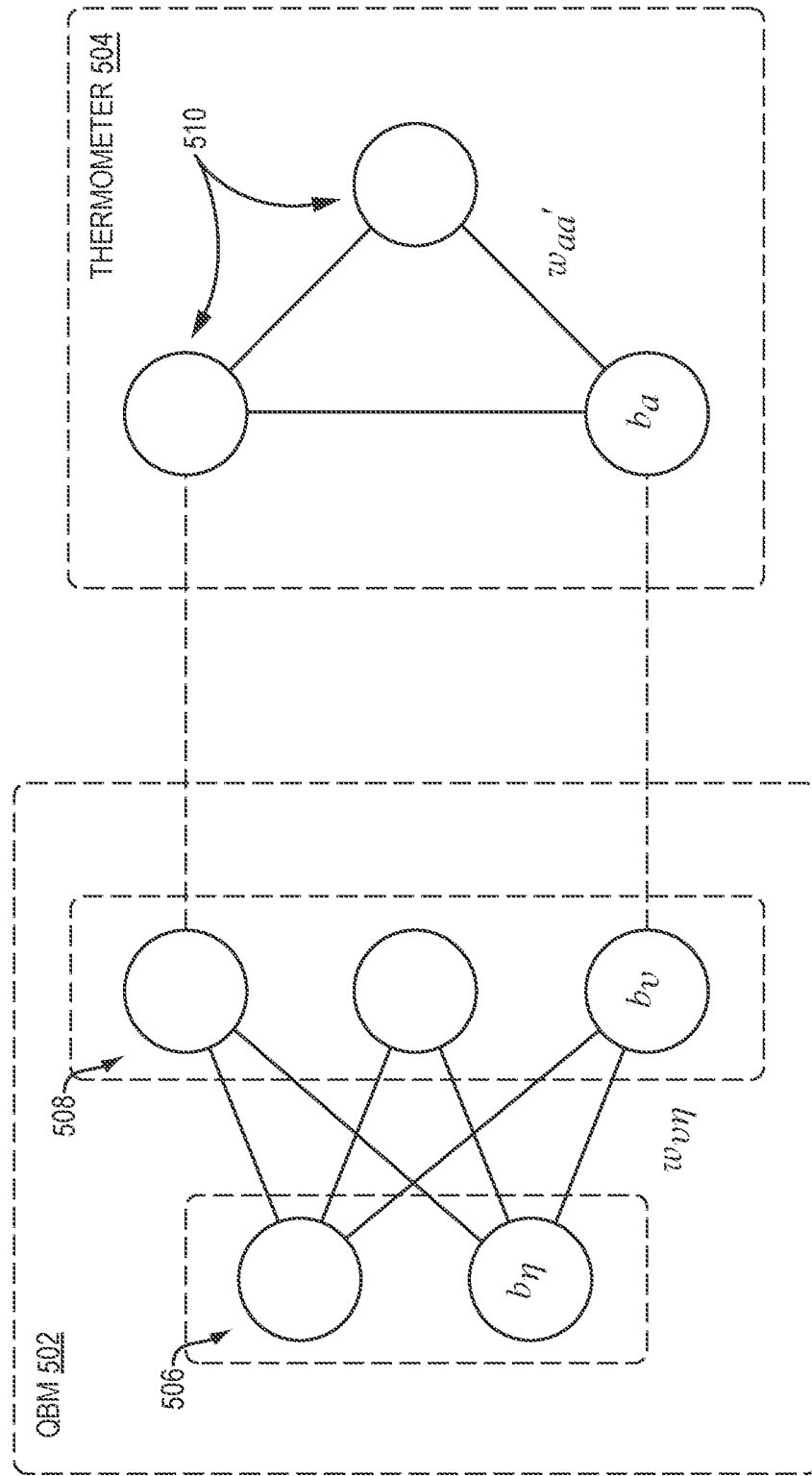
FIG. 5 shows one example of a quantum Boltzmann machine weakly coupled to a thermometer formed from a plurality of thermometer qubits, in an embodiment.

FIG. 5 shows one example of a QBM 502 weakly coupled to a thermometer 504 formed from a plurality of thermometer qubits 510. QBM 502 has a plurality of hidden qubits 506 corresponding to hidden units 404 of FIG. 4, and a plurality of visible qubits 506 corresponding to visible units 402 of FIG. 4. Qubits 508 and 506 are coupled according to a QBM Hamiltonian (e.g., $H_{QBM}$ of Eqn. 4 or Eqn. 5). QBM 502 and thermometer 504 may be coupled according to an interaction Hamiltonian $$H_{int} = \sum_{\nu',a} w_{\nu'a} \sigma_{\nu'}^z \sigma_a^z, \quad (20)$$

where v' runs over a subset of visible qubits 508, and a runs over a subset of thermometer qubits 510. $H_{int}$ is sparse compared to the $H_{QBM}$ such that the measured local temperature of thermometer 504 approximately equals a local temperature of QBM 502. While FIG. 5 shows QBM 502 as a restricted QBM corresponding to restricted Boltzmann machine 410 of FIG. 5, QBM 502 may be alternatively configured as an unrestricted QBM corresponding to Boltzmann machine 400 of FIG. 4, or as a semi-restricted QBM corresponding to semi-restricted Boltzmann machine 420 of FIG. 4.

Thermometer 504 and QBM 502, when coupled to form a combined system, may be represented by a total Hamiltonian:

$$H = H_{QBM} + H_{therm} + H_{int}. \quad (21)$$

At an initial time $t=t_0$, the combined system may be prepared in a pure state, such as $$|\psi(t_0)\rangle = |+\rangle^{\otimes n}, \quad (22)$$

which is an eigenstate of the off-diagonal part of the total Hamiltonian H. The initial state then evolves according to $$|\psi(t)\rangle = e^{-iHt}|\psi(t_0)\rangle \quad (23)$$

for $t \in \{T_i\}_i \equiv \mathcal{T}$. Under the conditions described above, for all sites i,j:

$$\mathbb{E}_{t\sim\mathcal{T}}[\langle\psi(t)|\sigma_i^z|\psi(t)\rangle] \approx \frac{tr(\sigma_i^z e^{-\beta H})}{tr(e^{-\beta H})}, \tag{24}$$

$$\mathbb{E}_{t\sim\mathcal{T}}[\langle\psi(t)|\sigma_i^z\sigma_j^z|\psi(t)\rangle] \approx \frac{tr(\sigma_i^z\sigma_j^z e^{-\beta H})}{tr(e^{-\beta H})}, \tag{25}$$

$$\mathbb{E}_{t\sim\mathcal{T}}[\langle\psi(t)|H_{QBM}|\psi(t)\rangle] \approx \frac{tr(H_{QBM}e^{-\beta H})}{tr(e^{-\beta H})}, \text{ and} \tag{26}$$

$$\mathbb{E}_{t\sim\mathcal{T}}[\langle\psi(t)|H_{therm}|\psi(t)\rangle] \approx \frac{tr(H_{therm}e^{-\beta H})}{tr(e^{-\beta H})}. \tag{27}$$

Details on the errors of the approximation made in Eqns. 24-27 are presented below in the section titled "Local thermalization and QBM Quench Dynamics". In principle, $|\mathcal{T}|=1$ may be chosen, although a larger $|\mathcal{T}|$ reduces the impact of fluctuations of observables away from their time average.

Note that Eqn. 27 defines β in the same sense as Eqn. 15. As $H_{therm}$ is known and has support on only $\mathcal{O}(1)$ qubits, β by can be found numerically by inverting Eqn. 27 after estimating the expectation value of the thermometer Hamiltonian $H_{therm}$ through sampling. Furthermore, given that $\|H_{int}\|$ is much smaller than $\|H_{QBM}\|$ and $\|H_{therm}\|$, the measured inverse temperature of the thermometer will approximate that of the QBM. Thus, all terms in Eqns. 9, 10, and 19 can be classical computed or approximated via sampling, from which the QBM can be trained efficiently.

Note that samples drawn from the trained QBM/thermometer combination will, in general, not be able to recreate the many-body correlations of generic data distributions. This is because ETH only guarantees thermalization on small subsystems of the QBM. However, if these higher-order correlations can be expressed in terms of lower-order correlations, the QBM/thermometer combination can still potentially model the distribution. To see this, assume that a fixed model for the data distribution over $n_v$ variables is completely described by m parameters. As there are $\mathcal{O}(n_v^k)$ components of the kth moment of the distribution, the data distribution model is completely determined by the first k moments of the distribution, where $$m = \mathcal{O}(n_v^k). \tag{28}$$

Eqn. 28 assumes that all components of the kth moment are independent; in general, if there are ι independent components of the kth moment, then $m=\mathcal{O}(n_v^k)$. Thus, even though samples from the QBM/thermometer combination can only approximate the first $\mathcal{O}(n_v)$ moments of the true QBM sample distribution, this is sufficient for completely reconstructing classes of distributions completely parametrized by $\mathcal{O}(n_v^{n_v})$ parameters through the method of moments. For instance, many classical data distributions, including distributions of images, can be modeled as a mixture of Bernoulli distributions of the form:

$$p(\vec{z}_v) = \frac{1}{m}\sum_{i=1}^m p_{Bernoulli}(\vec{z}_v; p_i, c_i), \text{ where} \tag{29}$$

$$p_{Bernoulli}(\vec{z}_v; p, \vec{c}) = p^{n_v - \left|\frac{\vec{z}_v - \vec{c}}{2}\right|}(1-p)^{\left|\frac{\vec{z}_v - \vec{c}}{2}\right|} \tag{30}$$

is a Bernoulli distribution centered at $\vec{c}$ and $|\vec{a}|$ denotes the number of components of $\vec{a}$ equal to $-1$. As this distribution is completely described by only 2 m parameters, for $m=\mathcal{O}(n_v^{n_v})$ the parameters of the model (and thus the entire data distribution, assuming a fixed model) can be estimated by the QBM/thermometer combination. Furthermore, by sampling directly from the QBM/thermometer combination p can be approximately sampled without explicitly reconstructing the model through the low order moments.

Local Thermalization and QBM Quench Dynamics

To explain Eqn. 18 in more detail, consider a quench of the form $$|\psi(t)\rangle = \sum_i c_i e^{-iE_i t}|E_i\rangle. \tag{31}$$

For an operator O, $$\bar{O} \equiv \lim_{t\to\infty}\frac{1}{t}\int_0^t dt'\langle\psi(t')|O|\psi(t')\rangle \tag{32}$$
$$= \lim_{t\to\infty}\frac{1}{t}\int_0^t dt'\sum_{i,j} c_i^* c_j e^{-i(E_j-E_i)t'}\langle E_i|O|E_j\rangle$$
$$= \sum_i |c_i|^2\langle E_i|O|E_i\rangle.$$

Taking O to have a volume of support $k=\mathcal{O}(n)$, using the ETH ansatz of Eqn. 12, and assuming that $S=\Omega(n)$ yields $$\bar{O} = \sum_i |c_i|^2 O_\omega(E_i) + \mathcal{O}(e^{-\frac{n}{2}}). \tag{33}$$

Defining $$E \equiv \langle\psi(0)|O|\psi(0)\rangle = \sum_i |c_i|^2 E_i, \tag{34}$$

$O_\omega(E_i)$ may be Taylor-expanded about E to obtain $$\bar{O} = \sum_i |c_i|^2 \left(O_\omega(E) + (E_i - E)\frac{dO_\omega(E')}{dE'}\bigg|_E + \right. \tag{35}$$
$$\left. \frac{1}{2}(E_i - E)^2 \frac{d^2 O_\omega(E')}{dE'^2}\bigg|_E\right) + \mathcal{O}\left(e^{-\frac{n}{2}} + \frac{\mathbb{E}_i[|E_i - E|^3]}{E^3}\right)$$
$$= O_\omega(E) + \mathcal{O}\left(e^{-\frac{n}{2}} + \frac{\mathbb{E}_i[|E_i - E|^2]}{E^2}\right).$$

Thus, the degree of approximation is good so long as $\mathbb{E}_i[|E_i - E|^2]/E^2$ is small.

The average difference between $\langle\psi(t)|O|\psi(t)\rangle$ and its long-time average $\bar{O}$ is also small. Using the ETH ansatz of Eqn. 12 yields $$\lim_{t\to\infty}\frac{1}{t}\int_0^t dt'\langle\psi(t')|O|\psi(t')\rangle^2 = \lim_{t\to\infty}\frac{1}{t}\int_0^t dt'\sum_{i,j,k,l} c_i^* c_j c_k^* c_l \tag{36}$$

-continued $$e^{-i(E_j+E_l-E_i-E_k)t'} \times$$
$$\langle E_i|O|E_j\rangle\langle E_k|O|E_l\rangle$$
$$= \left(\sum_i |c_i|^2 \langle E_i|O|E_i\rangle\right)^2 +$$
$$\sum_{i\neq j} |c_i|^2|c_j|^2|\langle E_i|O|E_j\rangle|^2.$$

From Eqn. 32 and the ETH ansatz of Eqn. 12, $$\lim_{t\to\infty}\frac{1}{t}\int_0^t dt'(\langle\psi(t')|O|\psi(t')\rangle^2 - \overline{O}^2) = \sum_{i\neq j}|c_i|^2|c_j|^2|\langle E_i|O|E_j\rangle|^2 \quad (37)$$
$$\leq \max_{i\neq j}|\langle E_i|O|E_j\rangle|^2$$
$$= \mathcal{O}(e^{-n}),$$

where again it is assumed that S=Ω(n).

Thus, assuming that expectation values of O in the microcanonical and canonical ensembles are equivalent up to $\mathcal{O}(k/n_v)$ terms (which is true for nonintegrable systems when the microcanonical entropy is concave in the energy and the energy is extensive in the system volume) yields $$\langle\psi(t)|O|\psi(t)\rangle = \frac{tr(Oe^{-\beta(\psi)H})}{tr(e^{-\beta(\psi)H})} + \mathcal{O}\left(\frac{k}{n_v} + \frac{\mathbb{E}_m[|E_m-E|^2]}{E^2}\right) \quad (38)$$

for t sufficiently large. When described as a trace distance between the partial traces to a subsystem of size k of $|\psi(t)\rangle\langle\psi(t)|$ and those of a canonical ensemble, this is equivalent to the subsystem ETH.

Thus, all that remains to be shown is that $\mathbb{E}_m[|E_m-E|^2]/E^2$ is small. For a restricted QBM with few hidden units, this is indeed true. Considering the quench procedure described above, where ψ(0) is assumed to be diagonal in the X basis for simplicity, this term is given by $$\frac{\mathbb{E}_m[|E_m-E|^2]}{E^2} = \frac{\langle\psi(0)|H^2|\psi(0)\rangle - \langle\psi(0)|H|\psi(0)\rangle^2}{\langle\psi(0)|H|\psi(0)\rangle^2} \quad (39)$$
$$= \frac{\left\langle\psi(0)\left|\left(\sum_i b_i\sigma_i^z + \sum_{v,\eta}w_{v\eta}\sigma_v^z\sigma_\eta^z\right)^2\right|\psi(0)\right\rangle}{\langle\psi(0)|H|\psi(0)\rangle^2}$$
$$= \frac{\sum_i b_i^2 + \sum_{v,\eta}w_{v\eta}^2}{\langle\psi(0)|H|\psi(0)\rangle^2}$$
$$= \mathcal{O}\left(\frac{n+n_v n_h}{n^2}\right).$$

Therefore, as long as the number of weights is subquadratic in the system size (i.e., $n_v n_h = \mathcal{O}(n^2)$) then $$\frac{\mathbb{E}_m[|E_m-E|^2]}{E^2} = \mathcal{O}(1). \quad (40)$$

Due to the apparent strength of QBMs with small numbers of hidden units, this is not an unreasonable assumption. However, this analysis does not hold for semi-restricted or unrestricted models, and indeed for numerically simulated generic semi-restricted transverse Ising models, this convergence does not appear to hold in the thermodynamic limit. On actual training data, though, the QBM/thermometer scheme appears to train well, even for the semi-restricted transverse Ising model. This could be due to Eqn. 39 giving, in general, that the necessary condition for thermalization is:

$$\sum_{i,j} w_{ij}^2 = \mathcal{O}(n); \quad (41)$$

thus, the apparent thermalization of even unrestricted QBMs may be due to visible-visible couplings being small during training. Alternatively, it could be due to the training procedure being robust to even constant errors in estimates of the gradient, and only strongly depending on, for example, the sign of the gradient.

Figure 6:
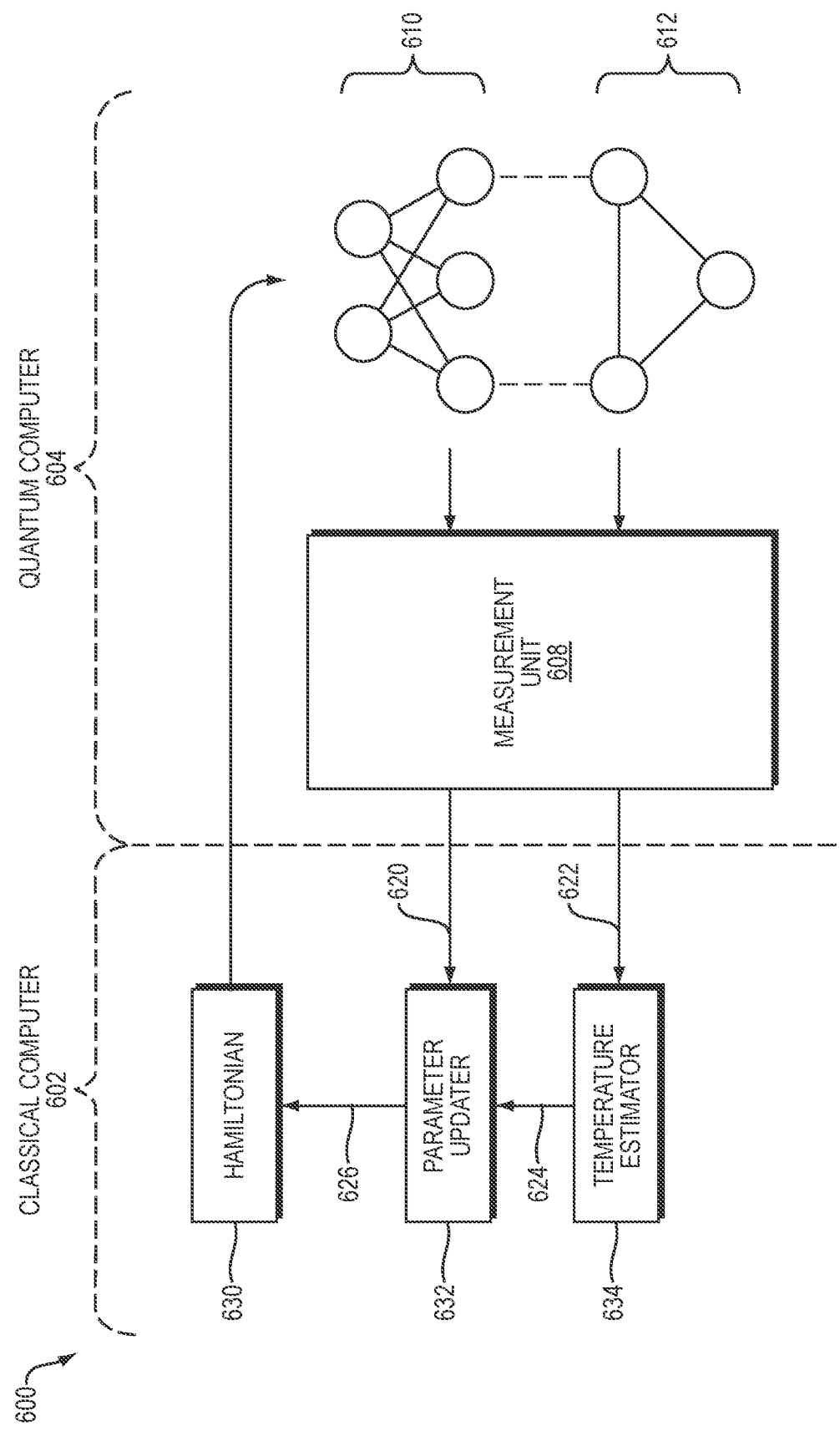
FIG. 6 is a block diagram illustrating one example of a hybrid quantum-classical computer with a classical computer and a quantum computer, in embodiments.

FIG. 6 is a block diagram illustrating one example of a hybrid quantum-classical computer 600 with a classical computer 602 and a quantum computer 604. Classical computer 602 may also be referred to as classical computing component 602, and quantum computer 604 may also be referred to as quantum computing component 604.

Quantum computer 604 implements a QBM (e.g., QBM 502 of FIG. 5) with a first plurality of m qubits 610, and a thermometer (e.g., thermometer 504 of FIG. 5) with a second plurality of n qubits 612. Here, n is less than m. The first plurality of qubits 610 interact with each other according to a Hamiltonian 630 specified by classical computer 602. The second plurality of qubits 612 also interact with each other according to Hamiltonian 630, and the second plurality of qubits 612 weakly interact with the first plurality of qubits 610 according to Hamiltonian 630. Qubits 610 and 612 are collectively prepared in a first quantum state.

Quantum computer 604 also includes a measurement unit 608 that measures a first set of expectation values 620 of observables on the first plurality of qubits 610. Measurement unit 608 also measures a second set of expectation values 622 of observables on the second plurality of qubits 612.

Classical computer 602 prepares a second quantum state based on the first quantum state and the first and second sets of expectation values 620, 622. Classical computer 602 does this with a temperature estimator 634 that identifies, based on the second set of expectation values 622, a value 624 of a temperature parameter of an ideal quantum Boltzmann distribution associated with the first plurality of qubits 610. Classical computer 602 also includes a parameter updater 632 that updates parameters 626 that define Hamiltonian 630. Parameter updater 632 updates parameters 626 based on the first set of expectation values 620 and the value 624 of the temperature parameter. For example, parameter updater 632 may estimate a gradient of a loss function (e.g., see Eqns. 9 and 10) to determine a parameter step that is added to previous parameters to obtain updated parameters 626. As another example, parameter updater 632 may use a non-gradient-based technique to update parameters 626. Once Hamiltonian 630 is updated with updated parameters 626, classical computer 602 may then prepare qubits 610 and 612 in the second quantum state to obtain updated expectation values 620, 622.

Although not shown explicitly in FIG. 6, classical computer 602 includes a processor and a memory storing computer-program code that, when executed by the processor, control classical computer 602 to implement the functionality of classical computer 602, including temperature estimator 634, parameter updater 632, and Hamiltonian 630.

In some embodiments, the first and second plurality of qubits 610, 612 are quenched under the Hamiltonian (e.g., see Eqn. 17). This quenching of the first and second plurality of qubits 610, 612 may include simulating time evolution of the first and second plurality of qubits 610, 612 by a quantum circuit in quantum computer 604. Alternatively, the simulating of time evolution may be performed by an analog quantum simulator in the quantum computer 604. Alternatively, the simulating of time evolution may be performed by a quantum annealer in the quantum computer 604.

In certain embodiments, hybrid quantum-classical computer 600 includes an additional computer system implementing an artificial neural network. The artificial neural network controls quantum computer 604 to measure the first and second set of expectation values 620, 622 (e.g., with measurement unit 608), and controls classical computer 602 to receive the first and second sets of expectation values 620, 622 and to prepare the second quantum state. The additional computer system may include classical computer 602 such that the additional computer system and classical computer 602 are one computer. Alternatively, the additional computer system may be separate from classical computer 602, wherein the additional computer system and classical computer 602 are communicable with each other.

In other embodiments, hybrid quantum-classical computer 600 includes only classical computer 602, which is configured to simulate operation of quantum computer 604. Specifically, classical computer 602 stores additional computer-program code tangibly stored on at least one non-transitory computer-readable medium, wherein the computer-program code, when executed by the processor of classical computer 602, controls classical computer 602 to simulate operation of quantum computer 604 without quantum computer 604.

Figure 7:
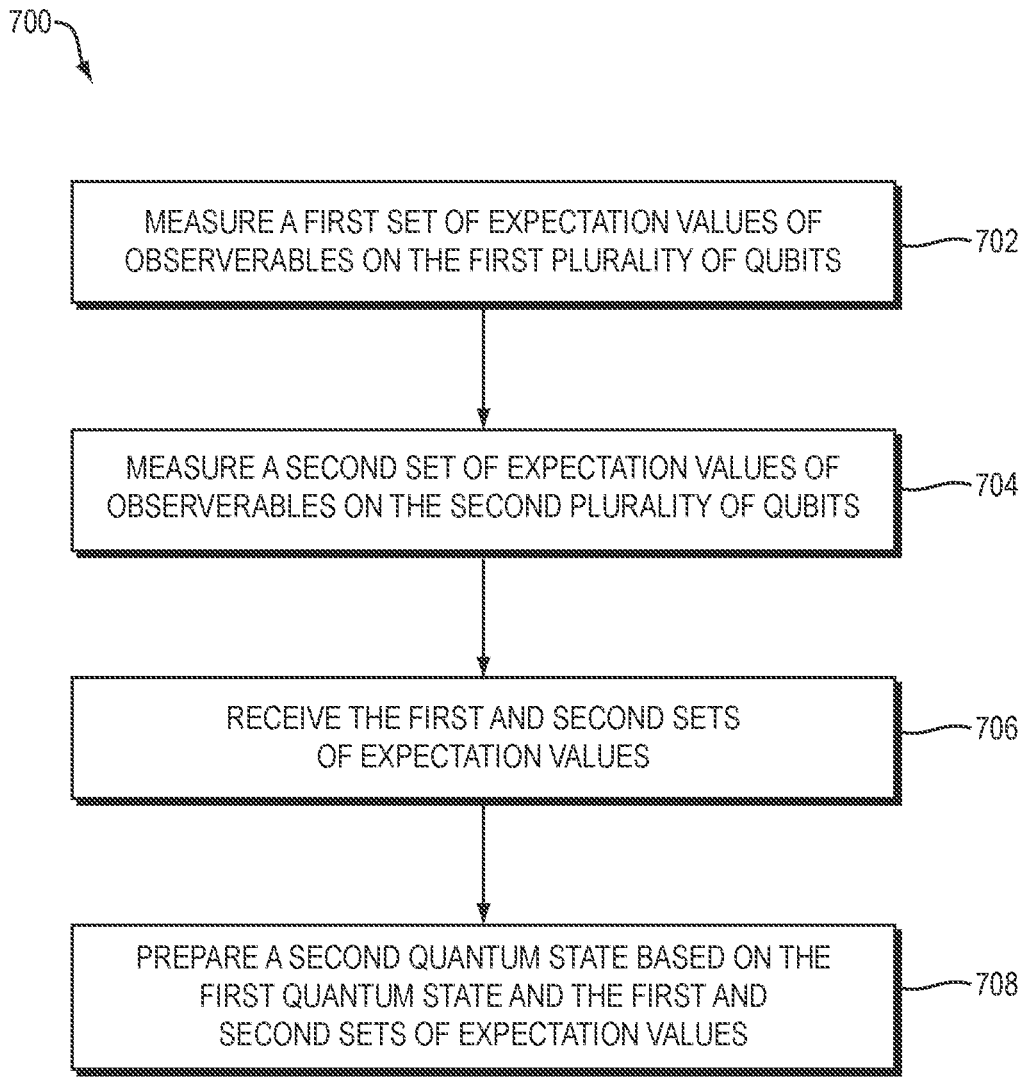
FIG. 7 is a flow chart of a method for preparing a state of a quantum Boltzmann machine that follows a probability distribution which locally approximates a Boltzmann distribution at a known temperature, in embodiments.

FIG. 7 is a flow chart of a method 700 for preparing a state of a quantum Boltzmann machine that follows a probability distribution which locally approximates a Boltzmann distribution at a known temperature. For clarity in the following discussion, method 700 is described as being implemented on hybrid quantum-classical computer 600 of FIG. 6. However, method 700 may be implemented with another hybrid quantum-classical computer without departing from the scope hereof.

Method 700 includes a block 702 and a block 704 that may occur in any order, or simultaneously. Blocks 702 and 704 both occur at measurement unit 608 of quantum computer 604 of hybrid quantum-classical computer 600. In block 702, measurement unit 608 measures a first set of expectation values of observables on the first plurality of qubits. In block 704, measurement unit 608 measures a second set of expectation values of observables on the second plurality of qubits. In one example of blocks 702 and 704, measurement unit 608 of quantum computer 604 measures expectation values 620 of observables on first plurality of qubits 610, and expectation values 622 of observables on second plurality of qubits 612.

Method 700 also includes a block 706 and a block 708 that both occur at classical computer 602 of hybrid quantum-classical computer 600. In block 706, classical computer 602 receives the first and second sets of expectation values from measurement unit 608. In block 708, classical computer 602 prepares a second quantum state based on the first quantum state and the first and second sets of expectation values. In one example of blocks 706 and 708, classical computer 602 receives first and second sets of expectation values 620, 622 from measurement unit 608, and process the first and second sets of expectation values 620, 622 to update parameters 626.

In some embodiments, method 700 further includes quenching the first and second plurality of qubits under Hamiltonian 630. Quenching may include simulating, by a quantum circuit in quantum computer 604, time evolution of the first and second plurality of qubits. The simulating may also be performed with an analog quantum simulator of quantum computer 604. The simulating may also be performed with a quantum annealer implemented with quantum computer 604.

In some embodiments, method 700 includes identifying a value of a temperature parameter of an ideal quantum Boltzmann distribution associated with the first plurality of qubits. In one example of these embodiments, temperature estimator 634 estimates a temperature of qubits 610 based on expectation values 622.

In certain embodiments, method 700 includes updating, based on the first and second sets of expectation values, parameters of Hamiltonian 630. In some of the embodiments, method 700 includes estimating, based on the first and second sets of expectation values, a gradient of a loss function. In one example, parameter updater 632 of classical computer 602 updated parameters 626 based on expectation values 620 and temperature 624 (which, in turn, is based on expectation values 622).

In some embodiments of method 700, classical computer 602 additionally stores an artificial neural network. Method 700 further includes executing the artificial neural network by controlling quantum computer 604 to perform blocks 702 and 704, and by controlling classical computer 602 to perform blocks 706 and 708. In other embodiments, the artificial neural network is stored on a classical computer that is separate from classical computer 602 and communicably coupled with classical computer 602.

In other embodiments of method 700, hybrid quantum-classical computer 600 includes only classical computer 602, which is configured to simulate operation of quantum computer 604 without quantum computer 604. In these embodiments, blocks 706 and 708 of method 700 are performed by classical computer 602.

Various physical embodiments of a quantum computer are suitable for use according to the present disclosure. In general, the fundamental data storage unit in quantum computing is the quantum bit, or qubit. The qubit is a quantum-computing analog of a classical digital computer system bit. A classical bit is considered to occupy, at any given point in time, one of two possible states corresponding to the binary digits (bits) 0 or 1. By contrast, a qubit is implemented in hardware by a physical medium with quantum-mechanical characteristics. Such a medium, which physically instantiates a qubit, may be referred to herein as a "physical instantiation of a qubit," a "physical embodiment of a qubit," a "medium embodying a qubit," or similar terms, or simply as a "qubit," for ease of explanation. It should be understood, therefore, that references herein to "qubits" within descriptions of embodiments of the present invention refer to physical media which embody qubits.

Each qubit has an infinite number of different potential quantum-mechanical states. When the state of a qubit is physically measured, the measurement produces one of two different basis states resolved from the state of the qubit. Thus, a single qubit can represent a one, a zero, or any quantum superposition of those two qubit states; a pair of qubits can be in any quantum superposition of 4 orthogonal basis states; and three qubits can be in any superposition of 8 orthogonal basis states. The function that defines the quantum-mechanical states of a qubit is known as its wavefunction. The wavefunction also specifies the probability distribution of outcomes for a given measurement. A qubit, which has a quantum state of dimension two (i.e., has two orthogonal basis states), may be generalized to a d-dimensional "qudit," where d may be any integral value, such as 2, 3, 4, or higher. In the general case of a qudit, measurement of the qudit produces one of d different basis states resolved from the state of the qudit. Any reference herein to a qubit should be understood to refer more generally to a d-dimensional qudit with any value of d.

Although certain descriptions of qubits herein may describe such qubits in terms of their mathematical properties, each such qubit may be implemented in a physical medium in any of a variety of different ways. Examples of such physical media include superconducting material, trapped ions, photons, optical cavities, individual electrons trapped within quantum dots, point defects in solids (e.g., phosphorus donors in silicon or nitrogen-vacancy centers in diamond), molecules (e.g., alanine, vanadium complexes), or aggregations of any of the foregoing that exhibit qubit behavior, that is, comprising quantum states and transitions therebetween that can be controllably induced or detected.

For any given medium that implements a qubit, any of a variety of properties of that medium may be chosen to implement the qubit. For example, if electrons are chosen to implement qubits, then the x component of its spin degree of freedom may be chosen as the property of such electrons to represent the states of such qubits. Alternatively, the y component, or the z component of the spin degree of freedom may be chosen as the property of such electrons to represent the state of such qubits. This is merely a specific example of the general feature that for any physical medium that is chosen to implement qubits, there may be multiple physical degrees of freedom (e.g., the x, y, and z components in the electron spin example) that may be chosen to represent 0 and 1. For any particular degree of freedom, the physical medium may controllably be put in a state of superposition, and measurements may then be taken in the chosen degree of freedom to obtain readouts of qubit values.

Certain implementations of quantum computers, referred as gate-model quantum computers, comprise quantum gates. In contrast to classical gates, there is an infinite number of possible single-qubit quantum gates that change the state vector of a qubit. Changing the state of a qubit state vector typically is referred to as a single-qubit rotation, and may also be referred to herein as a state change or a single-qubit quantum-gate operation. A rotation, state change, or single-qubit quantum-gate operation may be represented mathematically by a unitary 2×2 matrix with complex elements. A rotation corresponds to a rotation of a qubit state within its Hilbert space, which may be conceptualized as a rotation of the Bloch sphere (as is well-known to those having ordinary skill in the art, the Bloch sphere is a geometrical representation of the space of pure states of a qubit). Multi-qubit gates alter the quantum state of a set of qubits. For example, two-qubit gates rotate the state of two qubits as a rotation in the four-dimensional Hilbert space of the two qubits (as is well-known to those having ordinary skill in the art, a Hilbert space is an abstract vector space possessing the structure of an inner product that allows length and angle to be measured). Furthermore, Hilbert spaces are complete: there are enough limits in the space to allow the techniques of calculus to be used.

A quantum circuit may be specified as a sequence of quantum gates. As described in more detail below, the term "quantum gate," as used herein, refers to the application of a gate control signal (defined below) to one or more qubits to cause those qubits to undergo certain physical transformations and thereby to implement a logical gate operation. To conceptualize a quantum circuit, the matrices corresponding to the component quantum gates may be multiplied together in the order specified by the gate sequence to produce a 2n×2n complex matrix representing the same overall state change on n qubits. A quantum circuit may thus be expressed as a single resultant operator. However, designing a quantum circuit in terms of constituent gates allows the design to conform to a standard set of gates, and thus enable greater ease of deployment. A quantum circuit thus corresponds to a design for actions taken upon the physical components of a quantum computer.

A given variational quantum circuit may be parameterized in a suitable device-specific manner. More generally, the quantum gates making up a quantum circuit may have an associated plurality of tuning parameters. For example, in embodiments based on optical switching, tuning parameters may correspond to the angles of individual optical elements.

In certain embodiments of quantum circuits, the quantum circuit includes both one or more gates and one or more measurement operations. Quantum computers implemented using such quantum circuits are referred to herein as implementing "measurement feedback." For example, a quantum computer implementing measurement feedback may execute the gates in a quantum circuit and then measure only a subset (i.e., fewer than all) of the qubits in the quantum computer, and then decide which gate(s) to execute next based on the outcome(s) of the measurement(s). In particular, the measurement(s) may indicate a degree of error in the gate operation(s), and the quantum computer may decide which gate(s) to execute next based on the degree of error. The quantum computer may then execute the gate(s) indicated by the decision. This process of executing gates, measuring a subset of the qubits, and then deciding which gate(s) to execute next may be repeated any number of times. Measurement feedback may be useful for performing quantum error correction, but is not limited to use in performing quantum error correction. For every quantum circuit, there is an error-corrected implementation of the circuit with or without measurement feedback.

Not all quantum computers are gate-model quantum computers. Embodiments of the present invention are not limited to being implemented using gate model quantum computers. As an alternative example, embodiments of the present invention may be implemented, in whole or in part, using a quantum computer that is implemented using a quantum annealing architecture, which is an alternative to the gate model quantum computing architecture. More specifically, quantum annealing is a metaheuristic for finding the global minimum of a given objective function over a given set of candidate solutions (candidate states), by a process using quantum fluctuations.

Figure 2A:
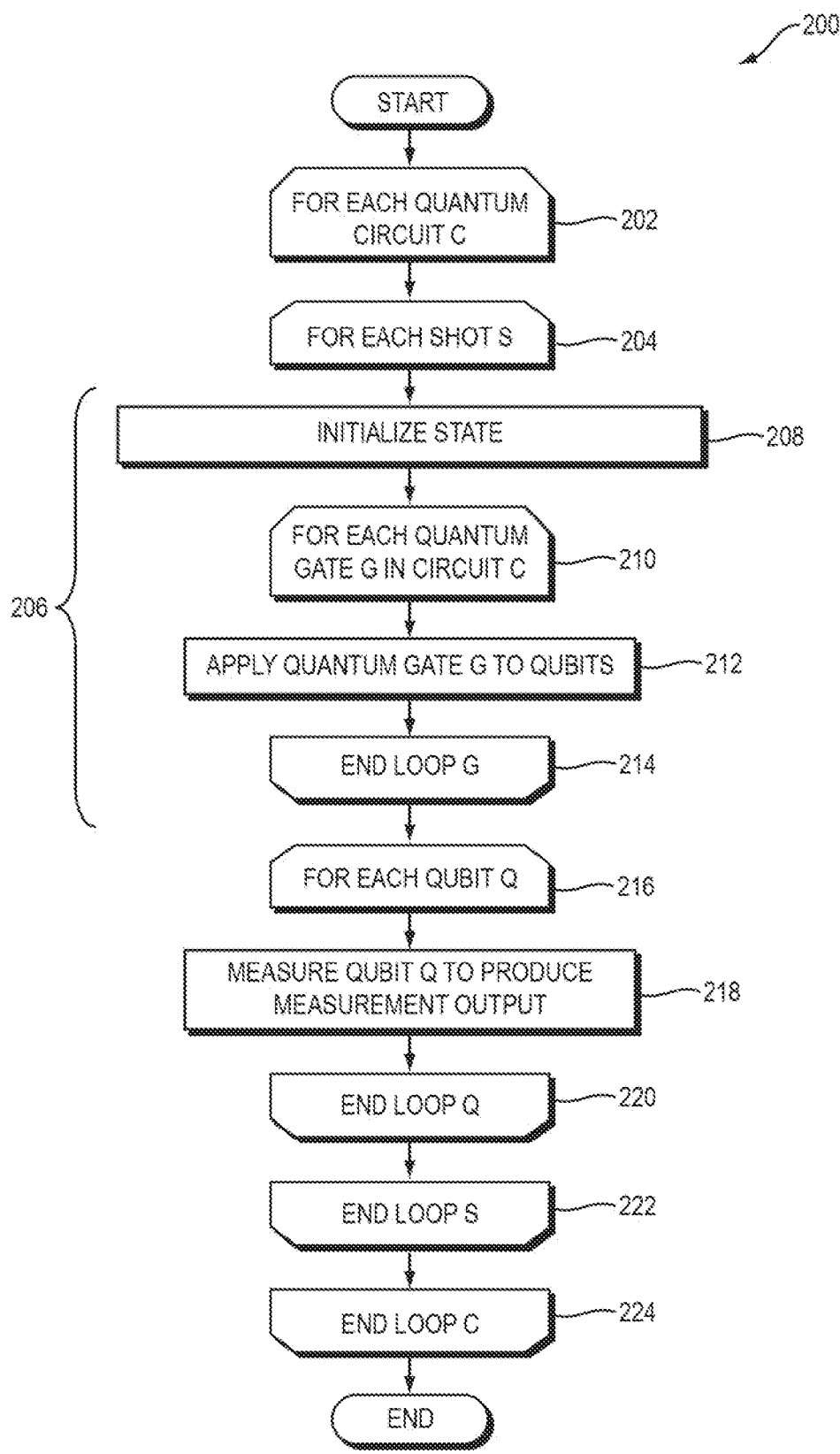
FIG. 2A is a flow chart of a method performed by the system of FIG. 1 according to one embodiment of the present invention.
Figure 2B:
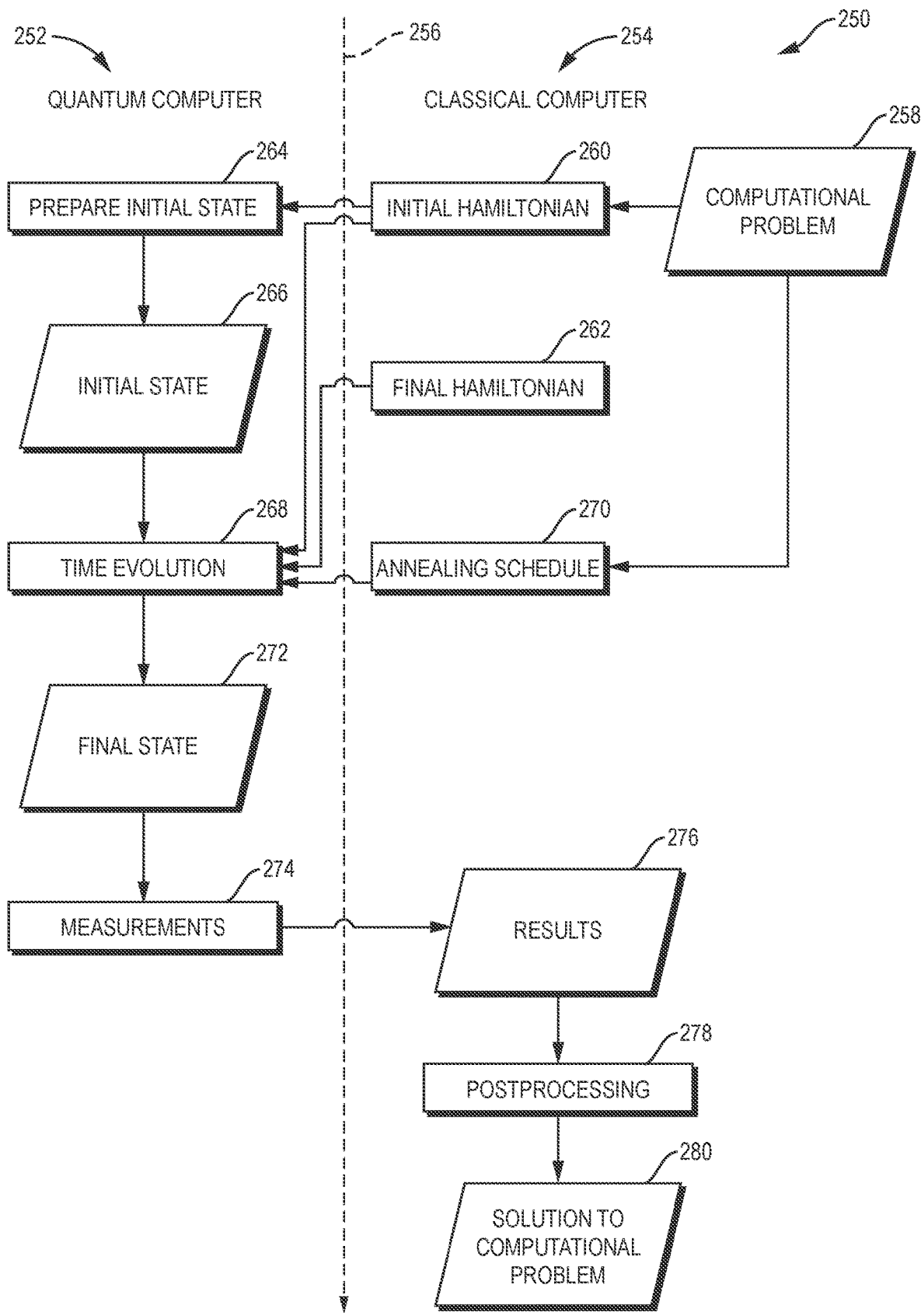
FIG. 2B is a diagram illustrating operations typically performed by a computer system which implements quantum annealing.

FIG. 2B is a diagram illustrating operations typically performed by a computer system 250 which implements quantum annealing. The computer system 250 includes both a quantum computer 252 and a classical computer 254. Operations shown on the left of the dashed vertical line 256 typically are performed by the quantum computer 252, while operations shown on the right of the dashed vertical line 256 typically are performed by the classical computer 254.

Quantum annealing starts with the classical computer 254 generating an initial Hamiltonian 260 and a final Hamiltonian 262 based on a computational problem 258 to be solved, and providing the initial Hamiltonian 260, the final Hamiltonian 262 and an annealing schedule 270 as input to the quantum computer 252. The quantum computer 252 prepares a well-known initial state 266 (FIG. 2B, operation 264), such as a quantum-mechanical superposition of all possible states (candidate states) with equal weights, based on the initial Hamiltonian 260. The classical computer 254 provides the initial Hamiltonian 260, a final Hamiltonian 262, and an annealing schedule 270 to the quantum computer 252. The quantum computer 252 starts in the initial state 266, and evolves its state according to the annealing schedule 270 following the time-dependent Schrodinger equation, a natural quantum-mechanical evolution of physical systems (FIG. 2B, operation 268). More specifically, the state of the quantum computer 252 undergoes time evolution under a time-dependent Hamiltonian, which starts from the initial Hamiltonian 260 and terminates at the final Hamiltonian 262. If the rate of change of the system Hamiltonian is slow enough, the system stays close to the ground state of the instantaneous Hamiltonian. If the rate of change of the system Hamiltonian is accelerated, the system may leave the ground state temporarily but produce a higher likelihood of concluding in the ground state of the final problem Hamiltonian, i.e., diabatic quantum computation. At the end of the time evolution, the set of qubits on the quantum annealer is in a final state 272, which is expected to be close to the ground state of the classical Ising model that corresponds to the solution to the original computational problem 258. An experimental demonstration of the success of quantum annealing for random magnets was reported immediately after the initial theoretical proposal.

The final state 272 of the quantum computer 252 is measured, thereby producing results 276 (i.e., measurements) (FIG. 2B, operation 274). The measurement operation 274 may be performed, for example, in any of the ways disclosed herein, such as in any of the ways disclosed herein in connection with the measurement unit 110 in FIG. 1. The classical computer 254 performs postprocessing on the measurement results 276 to produce output 280 representing a solution to the original computational problem 258 (FIG. 2B, operation 278).

As another alternative example, embodiments of the present invention may be implemented, in whole or in part, using a quantum computer that is implemented using a one-way quantum computing architecture, also referred to as a measurement-based quantum computing architecture, which is another alternative to the gate model quantum computing architecture. More specifically, the one-way or measurement based quantum computer is a method of quantum computing that first prepares an entangled resource state, usually a cluster state or graph state, then performs single qubit measurements on it. It is "one-way" because the resource state is destroyed by the measurements.

The outcome of each individual measurement is random, but they are related in such a way that the computation always succeeds. In general, the choices of basis for later measurements need to depend on the results of earlier measurements, and hence the measurements cannot all be performed at the same time.

Any of the functions disclosed herein may be implemented using means for performing those functions. Such means include, but are not limited to, any of the components disclosed herein, such as the computer-related components described below.

FIG. 1 is a diagram of a system 100 implemented according to one embodiment of the present invention. FIG. 2A is a flow chart of a method 200 performed by the system 100 of FIG. 1 according to one embodiment of the present invention. The system 100 includes a quantum computer 102. The quantum computer 102 includes a plurality of qubits 104, which may be implemented in any of the ways disclosed herein. There may be any number of qubits 104 in the quantum computer 102. For example, the qubits 104 may include or consist of no more than 2 qubits, no more than 4 qubits, no more than 8 qubits, no more than 16 qubits, no more than 32 qubits, no more than 64 qubits, no more than 128 qubits, no more than 256 qubits, no more than 512 qubits, no more than 1024 qubits, no more than 2048 qubits, no more than 4096 qubits, or no more than 8192 qubits. These are merely examples, in practice there may be any number of qubits 104 in the quantum computer 102.

There may be any number of gates in a quantum circuit. However, in some embodiments the number of gates may be at least proportional to the number of qubits 104 in the quantum computer 102. In some embodiments, the gate depth may be no greater than the number of qubits 104 in the quantum computer 102, or no greater than some linear multiple of the number of qubits 104 in the quantum computer 102 (e.g., 2, 3, 4, 5, 6, or 7).

The qubits 104 may be interconnected in any graph pattern. For example, they be connected in a linear chain, a two-dimensional grid, an all-to-all connection, any combination thereof, or any subgraph of any of the preceding.

As clarified below, although element 102 is referred to herein as a "quantum computer," this does not imply that all components of the quantum computer 102 leverage quantum phenomena. One or more components of the quantum computer 102 may, for example, be classical (i.e., non-quantum components) components which do not leverage quantum phenomena.

The quantum computer 102 includes a control unit 106, which may include any of a variety of circuitry and/or other machinery for performing the functions disclosed herein. The control unit 106 may, for example, consist entirely of classical components. The control unit 106 generates and provides as output one or more control signals 108 to the qubits 104. The control signals 108 may take any of a variety of forms, such as any kind of electromagnetic signals, such as electrical signals, magnetic signals, optical signals (e.g., laser pulses), or any combination thereof.

For example:

In embodiments in which some or all of the qubits 104 are implemented as photons (also referred to as a "quantum optical" implementation) that travel along waveguides, the control unit 106 may be a beam splitter (e.g., a heater or a mirror), the control signals 108 may be signals that control the heater or the rotation of the mirror, the measurement unit 110 may be a photodetector, and the measurement signals 112 may be photons.

In embodiments in which some or all of the qubits 104 are implemented as charge type qubits (e.g., transmon, X-mon, G-mon) or flux-type qubits (e.g., flux qubits, capacitively shunted flux qubits) (also referred to as a "circuit quantum electrodynamic" (circuit QED) implementation), the control unit 106 may be a bus resonator activated by a drive, the control signals 108 may be cavity modes, the measurement unit 110 may be a second resonator (e.g., a low-Q resonator), and the measurement signals 112 may be voltages measured from the second resonator using dispersive readout techniques.

In embodiments in which some or all of the qubits 104 are implemented as superconducting circuits, the control unit 106 may be a circuit QED-assisted control unit or a direct capacitive coupling control unit or an inductive capacitive coupling control unit, the control signals 108 may be cavity modes, the measurement unit 110 may be a second resonator (e.g., a low-Q resonator), and the measurement signals 112 may be voltages measured from the second resonator using dispersive readout techniques.

In embodiments in which some or all of the qubits 104 are implemented as trapped ions (e.g., electronic states of, e.g., magnesium ions), the control unit 106 may be a laser, the control signals 108 may be laser pulses, the measurement unit 110 may be a laser and either a CCD or a photodetector (e.g., a photomultiplier tube), and the measurement signals 112 may be photons.

In embodiments in which some or all of the qubits 104 are implemented using nuclear magnetic resonance (NMR) (in which case the qubits may be molecules, e.g., in liquid or solid form), the control unit 106 may be a radio frequency (RF) antenna, the control signals 108 may be RF fields emitted by the RF antenna, the measurement unit 110 may be another RF antenna, and the measurement signals 112 may be RF fields measured by the second RF antenna.

In embodiments in which some or all of the qubits 104 are implemented as nitrogen-vacancy centers (NV centers), the control unit 106 may, for example, be a laser, a microwave antenna, or a coil, the control signals 108 may be visible light, a microwave signal, or a constant electromagnetic field, the measurement unit 110 may be a photodetector, and the measurement signals 112 may be photons.

In embodiments in which some or all of the qubits 104 are implemented as two-dimensional quasiparticles called "anyons" (also referred to as a "topological quantum computer" implementation), the control unit 106 may be nanowires, the control signals 108 may be local electrical fields or microwave pulses, the measurement unit 110 may be superconducting circuits, and the measurement signals 112 may be voltages.

In embodiments in which some or all of the qubits 104 are implemented as semiconducting material (e.g., nanowires), the control unit 106 may be microfabricated gates, the control signals 108 may be RF or microwave signals, the measurement unit 110 may be microfabricated gates, and the measurement signals 112 may be RF or microwave signals.

Although not shown explicitly in FIG. 1 and not required, the measurement unit 110 may provide one or more feedback signals 114 to the control unit 106 based on the measurement signals 112. For example, quantum computers referred to as "one-way quantum computers" or "measurement-based quantum computers" utilize such feedback signals 114 from the measurement unit 110 to the control unit 106. Such feedback signals 114 is also necessary for the operation of fault-tolerant quantum computing and error correction.

The control signals 108 may, for example, include one or more state-preparation signals which, when received by the qubits 104, cause some or all of the qubits 104 to change their states. Such state-preparation signals constitute a quantum circuit also referred to as an "ansatz circuit." The resulting state of the qubits 104 is referred to herein as an "initial state" or an "ansatz state." The process of outputting the state-preparation signal(s) to cause the qubits 104 to be in their initial state is referred to herein as "state preparation" (FIG. 2A, operation 206). A special case of state preparation is "initialization," also referred to as a "reset operation," in which the initial state is one in which some or all of the qubits 104 are in the "zero" state i.e., the default single-qubit state (FIG. 2, operation 208). More generally, state preparation may involve using the state-preparation signals to cause some or all of the qubits 104 to be in any distribution of desired states. In some embodiments, the control unit 106 may first perform initialization on the qubits 104 and then perform preparation on the qubits 104, by first outputting a first set of state-preparation signals to initialize the qubits 104, and by then outputting a second set of state preparation signals to put the qubits 104 partially or entirely into non-zero states.

Another example of control signals 108 that may be output by the control unit 106 and received by the qubits 104 are gate-control signals. The control unit 106 may output such gate-control signals, thereby applying one or more gates to the qubits 104. Applying a gate to one or more qubits causes the set of qubits to undergo a physical state change which embodies a corresponding logical gate operation (e.g., single-qubit rotation, two-qubit entangling gate or multi-qubit operation) specified by the received gate control signal. As this implies, in response to receiving the gate-control signals, the qubits 104 undergo physical transformations which cause the qubits 104 to change state in such a way that the states of the qubits 104, when measured (see below), represent the results of performing logical gate operations specified by the gate-control signals. The term "quantum gate," as used herein, refers to the application of a gate-control signal to one or more qubits to cause those qubits to undergo the physical transformations described above and thereby to implement a logical gate operation.

It should be understood that the dividing line between state preparation (and the corresponding state preparation signals) and the application of gates (and the corresponding gate control signals) may be chosen arbitrarily. For example, some or all the components and operations that are illustrated in FIGS. 1 and 2A as elements of "state preparation" may instead be characterized as elements of gate application. Conversely, for example, some or all of the components and operations that are illustrated in FIGS. 1 and 2A as elements of "gate application" may instead be characterized as elements of state preparation. As one particular example, the system and method of FIGS. 1 and 2A may be characterized as solely performing state preparation followed by measurement, without any gate application, where the elements that are described herein as being part of gate application are instead considered to be part of state preparation. Conversely, for example, the system and method of FIGS. 1 and 2A may be characterized as solely performing gate application followed by measurement, without any state preparation, and where the elements that are described herein as being part of state preparation are instead considered to be part of gate application.

The quantum computer 102 also includes a measurement unit 110, which performs one or more measurement operations on the qubits 104 to read out measurement signals 112 (also referred to herein as "measurement results") from the qubits 104, where the measurement results 112 are signals representing the states of some or all of the qubits 104. In practice, the control unit 106 and the measurement unit 110 may be entirely distinct from each other, or contain some components in common with each other, or be implemented using a single unit (i.e., a single unit may implement both the control unit 106 and the measurement unit 110). For example, a laser unit may be used both to generate the control signals 108 and to provide stimulus (e.g., one or more laser beams) to the qubits 104 to cause the measurement signals 112 to be generated.

In general, the quantum computer 102 may perform various operations described above any number of times. For example, the control unit 106 may generate one or more control signals 108, thereby causing the qubits 104 to perform one or more quantum gate operations. The measurement unit 110 may then perform one or more measurement operations on the qubits 104 to read out a set of one or more measurement signals 112. The measurement unit 110 may repeat such measurement operations on the qubits 104 before the control unit 106 generates additional control signals 108, thereby causing the measurement unit 110 to read out additional measurement signals 112 resulting from the same gate operations that were performed before reading out the previous measurement signals 112. The measurement unit 110 may repeat this process any number of times to generate any number of measurement signals 112 corresponding to the same gate operations. The quantum computer 102 may then aggregate such multiple measurements of the same gate operations in any of a variety of ways.

After the measurement unit 110 has performed one or more measurement operations on the qubits 104 after they have performed one set of gate operations, the control unit 106 may generate one or more additional control signals 108, which may differ from the previous control signals 108, thereby causing the qubits 104 to perform one or more additional quantum gate operations, which may differ from the previous set of quantum gate operations. The process described above may then be repeated, with the measurement unit 110 performing one or more measurement operations on the qubits 104 in their new states (resulting from the most recently-performed gate operations).

In general, the system 100 may implement a plurality of quantum circuits as follows. For each quantum circuit C in the plurality of quantum circuits (FIG. 2A, operation 202), the system 100 performs a plurality of "shots" on the qubits 104. The meaning of a shot will become clear from the description that follows. For each shot S in the plurality of shots (FIG. 2A, operation 204), the system 100 prepares the state of the qubits 104 (FIG. 2A, section 206). More specifically, for each quantum gate G in quantum circuit C (FIG. 2A, operation 210), the system 100 applies quantum gate G to the qubits 104 (FIG. 2A, operations 212 and 214).

Then, for each of the qubits Q 104 (FIG. 2A, operation 216), the system 100 measures the qubit Q to produce measurement output representing a current state of qubit Q (FIG. 2A, operations 218 and 220).

The operations described above are repeated for each shot S (FIG. 2A, operation 222), and circuit C (FIG. 2A, operation 224). As the description above implies, a single "shot" involves preparing the state of the qubits 104 and applying all of the quantum gates in a circuit to the qubits 104 and then measuring the states of the qubits 104; and the system 100 may perform multiple shots for one or more circuits.

Figure 3:
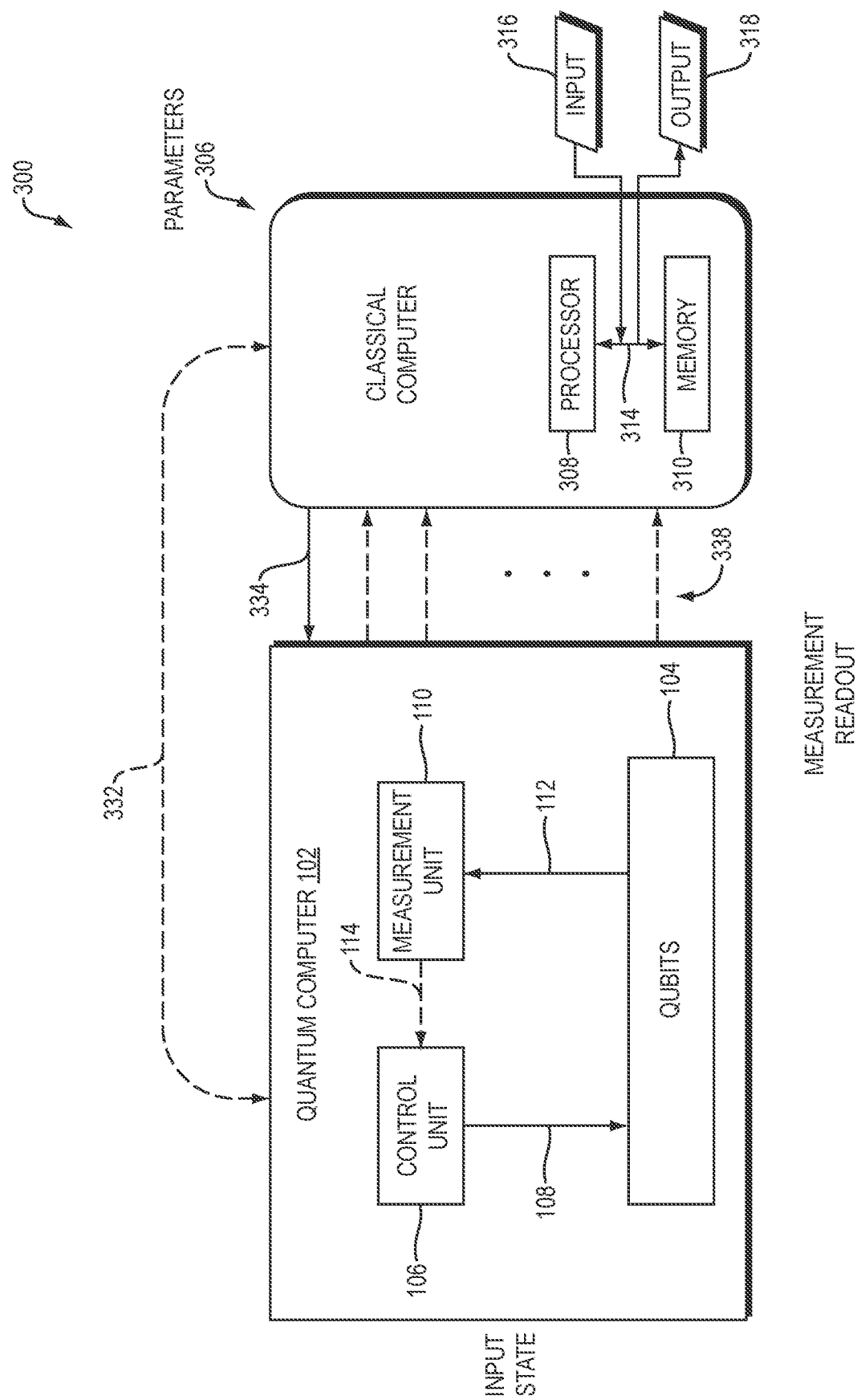
FIG. 3 is a diagram of a hybrid quantum-classical computer system implemented according to one embodiment of the present invention.

FIG. 3 is a diagram of a hybrid quantum-classical (HQC) computer system 300 implemented according to one embodiment of the present invention. The HQC computer system 300 includes a quantum computer component 102 (which may, for example, be implemented in the manner shown and described in connection with FIG. 1) and a classical computer component 306. The classical computer component may be a machine implemented according to the general computing model established by John von Neumann, in which programs are written in the form of ordered lists of instructions and stored within a classical (e.g., digital) memory 310 and executed by a classical (e.g., digital) processor 308 of the classical computer. The memory 310 is classical in the sense that it stores data in a storage medium in the form of bits, which have a single definite binary state at any point in time. The bits stored in the memory 310 may, for example, represent a computer program. The classical computer component 304 typically includes a bus 314. The processor 308 may read bits from and write bits to the memory 310 over the bus 314. For example, the processor 308 may read instructions from the computer program in the memory 310, and may optionally receive input data 316 from a source external to the computer 302, such as from a user input device such as a mouse, keyboard, or any other input device. The processor 308 may use instructions that have been read from the memory 310 to perform computations on data read from the memory 310 and/or the input 316, and generate output from those instructions. The processor 308 may store that output back into the memory 310 and/or provide the output externally as output data 318 via an output device, such as a monitor, speaker, or network device.

The quantum computer component 102 may include a plurality of qubits 104, as described above in connection with FIG. 1. A single qubit may represent a one, a zero, or any quantum superposition of those two qubit states. The classical computer component 304 may provide classical state preparation signals 332 to the quantum computer 102, in response to which the quantum computer 102 may prepare the states of the qubits 104 in any of the ways disclosed herein, such as in any of the ways disclosed in connection with FIGS. 1 and 2A.

Once the qubits 104 have been prepared, the classical processor 308 may provide classical control signals 334 to the quantum computer 102, in response to which the quantum computer 102 may apply the gate operations specified by the control signals 332 to the qubits 104, as a result of which the qubits 104 arrive at a final state. The measurement unit 110 in the quantum computer 102 (which may be implemented as described above in connection with FIGS. 1 and 2A) may measure the states of the qubits 104 and produce measurement output 338 representing the collapse of the states of the qubits 104 into one of their eigenstates. As a result, the measurement output 338 includes or consists of bits and therefore represents a classical state. The quantum computer 102 provides the measurement output 338 to the classical processor 308. The classical processor 308 may store data representing the measurement output 338 and/or data derived therefrom in the classical memory 310.

The steps described above may be repeated any number of times, with what is described above as the final state of the qubits 104 serving as the initial state of the next iteration. In this way, the classical computer 304 and the quantum computer 102 may cooperate as co-processors to perform joint computations as a single computer system.

Although certain functions may be described herein as being performed by a classical computer and other functions may be described herein as being performed by a quantum computer, these are merely examples and do not constitute limitations of the present invention. A subset of the functions which are disclosed herein as being performed by a quantum computer may instead be performed by a classical computer. For example, a classical computer may execute functionality for emulating a quantum computer and provide a subset of the functionality described herein, albeit with functionality limited by the exponential scaling of the simulation. Functions which are disclosed herein as being performed by a classical computer may instead be performed by a quantum computer.

The techniques described above may be implemented, for example, in hardware, in one or more computer programs tangibly stored on one or more computer-readable media, firmware, or any combination thereof, such as solely on a quantum computer, solely on a classical computer, or on an HQC computer system. The techniques disclosed herein may, for example, be implemented solely on a classical computer, in which the classical computer emulates the quantum computer functions disclosed herein.

The techniques described above may be implemented in one or more computer programs executing on (or executable by) a programmable computer (such as a classical computer, a quantum computer, or an HQC computer system) including any combination of any number of the following: a processor, a storage medium readable and/or writable by the processor (including, for example, volatile and non-volatile memory and/or storage elements), an input device, and an output device. Program code may be applied to input entered using the input device to perform the functions described and to generate output using the output device.

Embodiments of the present invention include features which are only possible and/or feasible to implement with the use of one or more computers, computer processors, and/or other elements of a computer system. Such features are either impossible or impractical to implement mentally and/or manually. For example, the Boltzmann temperatures estimated herein are obtained from measurements of qubits of a quantum computer. For moderately large systems (e.g., at least 50 qubits) these features would be infeasible or impossible to perform manually or even using a classical computer.

Any claims herein which affirmatively require a computer, a processor, a memory, or similar computer-related elements, are intended to require such elements, and should not be interpreted as if such elements are not present in or required by such claims. Such claims are not intended, and should not be interpreted, to cover methods and/or systems which lack the recited computer-related elements. For example, any method claim herein which recites that the claimed method is performed by a computer, a processor, a memory, and/or similar computer-related element, is intended to, and should only be interpreted to, encompass methods which are performed by the recited computer-related element(s). Such a method claim should not be interpreted, for example, to encompass a method that is performed mentally or by hand (e.g., using pencil and paper). Similarly, any product claim herein which recites that the claimed product includes a computer, a processor, a memory, and/or similar computer-related element, is intended to, and should only be interpreted to, encompass products which include the recited computer-related element(s). Such a product claim should not be interpreted, for example, to encompass a product that does not include the recited computer-related element(s).

In embodiments in which a classical computing component executes a computer program providing any subset of the functionality within the scope of the claims below, the computer program may be implemented in any programming language, such as assembly language, machine language, a high-level procedural programming language, or an object-oriented programming language. The programming language may, for example, be a compiled or interpreted programming language.

Each such computer program may be implemented in a computer program product tangibly embodied in a machine-readable storage device for execution by a computer processor, which may be either a classical processor or a quantum processor. Method steps of the invention may be performed by one or more computer processors executing a program tangibly embodied on a computer-readable medium to perform functions of the invention by operating on input and generating output. Suitable processors include, by way of example, both general and special purpose microprocessors. Generally, the processor receives (reads) instructions and data from a memory (such as a read-only memory and/or a random-access memory) and writes (stores) instructions and data to the memory. Storage devices suitable for tangibly embodying computer program instructions and data include, for example, all forms of non-volatile memory, such as semiconductor memory devices, including EPROM, EEPROM, and flash memory devices; magnetic disks such as internal hard disks and removable disks; magneto-optical disks; and CD-ROMs. Any of the foregoing may be supplemented by, or incorporated in, specially-designed ASICs (application-specific integrated circuits) or FPGAs (field-programmable gate arrays). A classical computer can generally also receive (read) programs and data from, and write (store) programs and data to, a non-transitory computer-readable storage medium such as an internal disk (not shown) or a removable disk. These elements will also be found in a conventional desktop or workstation computer as well as other computers suitable for executing computer programs implementing the methods described herein, which may be used in conjunction with any digital print engine or marking engine, display monitor, or other raster output device capable of producing color or gray scale pixels on paper, film, display screen, or other output medium.

It is to be understood that although the invention has been described above in terms of particular embodiments, the foregoing embodiments are provided as illustrative only, and do not limit or define the scope of the invention. Various other embodiments, including but not limited to the following, are also within the scope of the claims. For example, elements and components described herein may be further divided into additional components or joined together to form fewer components for performing the same functions.

Any data disclosed herein may be implemented, for example, in one or more data structures tangibly stored on a non-transitory computer-readable medium. Embodiments of the invention may store such data in such data structure(s) and read such data from such data structure(s).

The following embodiments are specifically contemplated, as well as any combinations of such embodiments that are compatible with one another:

(A) A hybrid quantum-classical computer, including a classical computing component and a quantum computing component. The quantum computing component includes a first plurality of m qubits and a second plurality of n qubits prepared in a first quantum state, wherein n is less than m. The first plurality of qubits interact with each other according to a Hamiltonian specified by the classical computing component. The second plurality of qubits interacting with each other according to the Hamiltonian, and the second plurality of qubits weakly interacting with the first plurality of qubits according to the Hamiltonian. The quantum computing component also includes a measurement unit that measures: (1) a first set of expectation values of observables on the first plurality of qubits; and (2) a second set of expectation values of observables on the second plurality of qubits. The classical computing component includes a processor that receives the first and second sets of expectation values from the measurement unit and prepares a second quantum state based on the first quantum state and the first and second sets of expectation values.

(B) In the hybrid quantum-classical computer denoted as (A), the first and second plurality of qubits are quenched under the Hamiltonian.

(C) In either of the hybrid quantum-classical computers denoted as (A) or (B), the quenching of the first and second plurality of qubits includes simulating time evolution of the first and second plurality of qubits by a quantum circuit in the quantum computing component.

(D) In any of the hybrid quantum-classical computers denoted as (A)-(C), the quenching of the first and second plurality of qubits includes simulating time evolution of the first and second plurality of qubits by an analog quantum simulator in the quantum computing component.

(E) In any of the hybrid quantum-classical computers denoted as (A)-(D), the quenching of the first and second plurality of qubits includes simulating time evolution of the first and second plurality of qubits by a quantum annealer in the quantum computing component.

(F) In any of the hybrid quantum-classical computers denoted as (A)-(E), the classical computing component further includes computer program code tangibly stored on at least one non-transitory computer-readable medium, wherein the computer program code is executable by the processor to simulate the quantum computing component.

(G) In any of the hybrid quantum-classical computers denoted as (A)-(F), after the quenching, the second set of expectation values identifies a value of a temperature parameter of an ideal quantum Boltzmann distribution associated with the first plurality of qubits.

(H) In any of the hybrid quantum-classical computers denoted as (A)-(G), the classical computing component uses the first and second sets of expectation values to estimate a gradient of a loss function.

(I) In any of the hybrid quantum-classical computers denoted as (A)-(H), the classical computing component uses the first and second sets of expectation values to update the parameters of the Hamiltonian.

(J) In any of the hybrid quantum-classical computers denoted as (A)-(I), further including a computer system implementing an artificial neural network, wherein the artificial neural network controls the quantum computing component to measure the first and second set of expectation values and controls the classical computing component to receive the first and second sets of expectation values and to prepare the second quantum state.

(K) In any of the hybrid quantum-classical computers denoted as (A)-(J), the computer system includes the classical computing component.

(L) A method for preparing a state of a quantum Boltzmann machine that follows a probability distribution which locally approximates a Boltzmann distribution at a known temperature is implemented on a hybrid quantum-classical computer. The hybrid quantum-classical computer includes a classical computing component and a quantum computing component. The quantum computing component includes a measurement unit, and a first plurality of m qubits and a second plurality of n qubits prepared in a first quantum state, wherein n is less than m. The first plurality of qubits interact with each other according to a Hamiltonian specified by the classical computing component. The second plurality of qubits interact with each other according to the Hamiltonian. The second plurality of qubits weakly interact with the first plurality of qubits according to the Hamiltonian. The classical computing component includes a processor, a non-transitory computer-readable medium, and computer-program instructions stored in the non-transitory computer-readable medium. The method includes, at the measurement unit of the quantum computing component: (1) measuring a first set of expectation values of observables on the first plurality of qubits, and (2) measuring a second set of expectation values of observables on the second plurality of qubits. The method also includes, at the classical computing component: (3) receiving the first and second sets of expectation values from the measurement unit, and (4) preparing a second quantum state based on the first quantum state and the first and second sets of expectation values.

(M) In the method denoted by (L), at the quantum computing component: quenching the first and second plurality of qubits under the Hamiltonian.

(N) In either of the methods denoted by (L) and (M), the quenching of the first and second plurality of qubits includes, at a quantum circuit in the quantum computing component, simulating time evolution of the first and second plurality of qubits.

(O) In any of the methods denoted by (L)-(N), the quenching of the first and second plurality of qubits includes, at an analog quantum simulator in the quantum computing component, simulating time evolution of the first and second plurality of qubits.

(P) In any of the methods denoted by (L)-(O), the quenching of the first and second plurality of qubits includes, at a quantum annealer in the quantum computing component, simulating time evolution of the first and second plurality of qubits.

(Q) In any of the methods denoted by (L)-(P), further including, at the classical computing component, simulating the quantum computing component.

(R) In any of the methods denoted by (L)-(Q), wherein after the quenching, the second set of expectation values identifies a value of a temperature parameter of an ideal quantum Boltzmann distribution associated with the first plurality of qubits.

(S) In any of the methods denoted by (L)-(R), further including, at the classical computing component, using the first and second sets of expectation values to estimate a gradient of a loss function.

(T) In any of the methods denoted by (L)-(S), further including, at the classical computing component, using the first and second sets of expectation values to update the parameters of the Hamiltonian.

(U) In any of the methods denoted by (L)-(T), further including: at the classical computing component, executing an artificial neural network, wherein executing the artificial neural network comprises: controlling the quantum computing component to perform (1) and (2); and controlling the classical computing component to perform (3) and (4).

(V) In any of the methods denoted by (L)-(U), further comprising: at a computer system not including the classical computing component, executing an artificial neural network, wherein executing the artificial neural network comprises: controlling the quantum computing component to perform (1) and (2); and controlling the classical computing component to perform (3) and (4).

What is claimed is:
1. A hybrid quantum-classical computer, comprising:
a classical computing component;
a quantum computing component comprising:
a first plurality of m qubits and a second plurality of n qubits prepared in a first quantum state, wherein n is less than m;
the first plurality of qubits interacting with each other according to a Hamiltonian specified by the classical computing component;

the second plurality of qubits interacting with each other according to the Hamiltonian; and the second plurality of qubits weakly interacting with the first plurality of qubits according to the Hamiltonian; and a measurement unit that measures:
(1) a first set of expectation values of observables on the first plurality of qubits; and
(2) a second set of expectation values of observables on the second plurality of qubits; and the classical computing component comprising a processor that receives the first and second sets of expectation values from the measurement unit and prepares a second quantum state based on the first quantum state and the first and second sets of expectation values.

2. The hybrid quantum-classical computer of claim 1, wherein the first and second plurality of qubits are quenched under the Hamiltonian.

3. The hybrid quantum-classical computer of claim 2, wherein the quenching of the first and second plurality of qubits comprises simulating time evolution of the first and second plurality of qubits by a quantum circuit in the quantum computing component.

4. The hybrid quantum-classical computer of claim 2, wherein the quenching of the first and second plurality of qubits comprises simulating time evolution of the first and second plurality of qubits by an analog quantum simulator in the quantum computing component.

5. The hybrid quantum-classical computer of claim 2, wherein the quenching of the first and second plurality of qubits comprises simulating time evolution of the first and second plurality of qubits by a quantum annealer in the quantum computing component.

6. The hybrid quantum-classical computer of claim 2, wherein the classical computing component further comprises computer program code tangibly stored on at least one non-transitory computer-readable medium, wherein the computer program code is executable by the processor to simulate the quantum computing component.

7. The hybrid quantum-classical computer of claim 2, wherein after the quenching, the second set of expectation values identifies a value of a temperature parameter of an ideal quantum Boltzmann distribution associated with the first plurality of qubits.

8. The hybrid quantum-classical computer of claim 1, wherein the classical computing component uses the first and second sets of expectation values to estimate a gradient of a loss function.

9. The hybrid quantum-classical computer of claim 1, wherein the classical computing component uses the first and second sets of expectation values to update the parameters of the Hamiltonian.

10. The hybrid quantum-classical computer of claim 1, further comprising a computer system implementing an artificial neural network, wherein the artificial neural network controls the quantum computing component to measure the first and second set of expectation values and controls the classical computing component to receive the first and second sets of expectation values and to prepare the second quantum state.

11. The hybrid quantum-classical computer of claim 10, wherein the computer system includes the classical computing component.

12. A method for preparing, by a hybrid quantum-classical computer, a state of a quantum Boltzmann machine that follows a probability distribution which locally approximates a Boltzmann distribution at a known temperature, the hybrid quantum-classical computer comprising:

a classical computing component;
a quantum computing component comprising:
a measurement unit;
a first plurality of m qubits and a second plurality of n qubits prepared in a first quantum state, wherein n is less than m;
the first plurality of qubits interacting with each other according to a Hamiltonian specified by the classical computing component;
the second plurality of qubits interacting with each other according to the Hamiltonian; and
the second plurality of qubits weakly interacting with the first plurality of qubits according to the Hamiltonian; and
the classical computing component including a processor, a non-transitory computer-readable medium, and computer-program instructions stored in the non-transitory computer-readable medium;

the method comprising:
at the measurement unit of the quantum computing component:
(1) measuring a first set of expectation values of observables on the first plurality of qubits; and
(2) measuring a second set of expectation values of observables on the second plurality of qubits; and
at the classical computing component:
(3) receiving the first and second sets of expectation values from the measurement unit; and
(4) preparing a second quantum state based on the first quantum state and the first and second sets of expectation values.

13. The method of claim 12, further comprising, at the quantum computing component: quenching the first and second plurality of qubits under the Hamiltonian.

14. The method of claim 13, wherein the quenching of the first and second plurality of qubits comprises, at a quantum circuit in the quantum computing component, simulating time evolution of the first and second plurality of qubits.

15. The method of claim 13, wherein the quenching of the first and second plurality of qubits comprises, at an analog quantum simulator in the quantum computing component, simulating time evolution of the first and second plurality of qubits.

16. The method of claim 13, wherein the quenching of the first and second plurality of qubits comprises, at a quantum annealer in the quantum computing component, simulating time evolution of the first and second plurality of qubits.

17. The method of claim 13, further comprising, at the classical computing component, simulating the quantum computing component.

18. The method of claim 13, wherein after the quenching, the second set of expectation values identifies a value of a temperature parameter of an ideal quantum Boltzmann distribution associated with the first plurality of qubits.

19. The method of claim 12, further comprising, at the classical computing component, using the first and second sets of expectation values to estimate a gradient of a loss function.

20. The method of claim 12, further comprising, at the classical computing component, using the first and second sets of expectation values to update the parameters of the Hamiltonian.

21. The method of claim 12, further comprising:

at the classical computing component, executing an artificial neural network, wherein executing the artificial neural network comprises:

controlling the quantum computing component to perform (1) and (2); and controlling the classical computing component to perform (3) and (4).

22. The method of claim 12, further comprising:

at a computer system not including the classical computing component, executing an artificial neural network, wherein executing the artificial neural network comprises:

controlling the quantum computing component to perform (1) and (2); and controlling the classical computing component to perform (3) and (4).

* * * * *